US012635236B2

(12) United States Patent
Zhang et al.

(10) Patent No.: US 12,635,236 B2
(45) Date of Patent: May 19, 2026

(54) STACKED FET ARCHITECTURE WITH SEPARATE GATE REGIONS

(71) Applicant: International Business Machines Corporation, Armonk, NY (US)

(72) Inventors: Chen Zhang, Guilderland, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 545 days.

(21) Appl. No.: 17/857,867

(22) Filed: Jul. 5, 2022

(65) Prior Publication Data
US 2024/0014212 A1     Jan. 11, 2024

(51) Int. Cl.
| | |
|---|---|
| *H01L 21/78* | (2006.01) |
| *H10D 30/67* | (2025.01) |
| *H10D 62/10* | (2025.01) |
| *H10D 64/01* | (2025.01) |
| *H10D 84/01* | (2025.01) |
| *H10D 84/03* | (2025.01) |
| *H10D 84/85* | (2025.01) |
| *H10D 88/00* | (2025.01) |

(52) U.S. Cl.
CPC ....... *H10D 84/856* (2025.01); *H10D 30/6735* (2025.01); *H10D 30/6757* (2025.01); *H10D 62/121* (2025.01); *H10D 64/017* (2025.01); *H10D 84/0167* (2025.01); *H10D 84/038* (2025.01); *H10D 88/01* (2025.01)

(58) Field of Classification Search
CPC ............. H10D 84/856; H10D 30/6735; H10D 30/6757; H10D 62/121; H10D 64/017; H10D 84/0167; H10D 84/038; H10D 88/01; H10D 30/43; H10D 84/0188; H10D 84/0177; H10D 84/0179; H10D 84/85; H10D 88/00; B82Y 10/00
USPC ......................................................... 257/369
See application file for complete search history.

(56) References Cited

U.S. PATENT DOCUMENTS

| | | | |
|---|---|---|---|
| 9,356,027 B1 | 5/2016 | Cheng et al. | |
| 9,831,131 B1 | 11/2017 | Jacob | |
| 9,991,261 B2 | 6/2018 | Mitard | |
| 10,170,484 B1 | 1/2019 | Sung et al. | |
| 10,741,456 B2 * | 8/2020 | Cheng .................... | H10D 30/43 |
| 10,879,352 B2 * | 12/2020 | Zhang ............... | H01L 21/02112 |
| 10,950,610 B2 | 3/2021 | Paul et al. | |
| 11,152,360 B2 | 10/2021 | Barraud | |
| 11,171,136 B2 * | 11/2021 | Kim ....................... | H10D 84/85 |
| 11,367,722 B2 * | 6/2022 | Lilak .................. | H10D 84/0177 |
| 11,621,197 B2 * | 4/2023 | Su ........................ | H10D 62/121 257/288 |
| 11,646,318 B2 * | 5/2023 | Chanemougame .... | H10D 30/43 257/401 |

(Continued)

FOREIGN PATENT DOCUMENTS

EP          3588578 A1     1/2020

*Primary Examiner* — Vu A Vu

(74) *Attorney, Agent, or Firm* — Harrity & Harrity, LLP

(57) ABSTRACT

A stacked FET architecture includes isolated pockets for replacement metal gates for top and bottom nanosheet field-effect transistors. Different work function metals are employed for the metal gates of n-type and p-type FETs. The architecture allows flexibility in providing electrically connected or unconnected metal gates.

20 Claims, 30 Drawing Sheets

(56) References Cited

U.S. PATENT DOCUMENTS

| | | | |
|---|---|---|---|
| 11,664,433 B2 * | 5/2023 | Hong | H10D 30/43 |
| | | | 257/288 |
| 11,670,677 B2 * | 6/2023 | Jun | H10D 84/0149 |
| | | | 257/288 |
| 12,356,665 B2 * | 7/2025 | Yun | H10D 30/6735 |
| 2019/0131394 A1 | 5/2019 | Reznicek et al. | |
| 2020/0266218 A1 * | 8/2020 | Lilak | H10D 30/014 |
| 2021/0028169 A1 | 1/2021 | Smith et al. | |
| 2021/0349691 A1 | 11/2021 | Hekmatshoartabari | |
| 2023/0089395 A1 * | 3/2023 | Orr | H10D 88/00 |
| | | | 257/369 |

* cited by examiner

*FIG. 35*

STACKED FET ARCHITECTURE WITH SEPARATE GATE REGIONS

BACKGROUND

The present invention relates generally to the electrical, electronic and computer arts and, more particularly, to stacked FET architectures having isolated pockets for replacement metal gates and methods for forming such architectures.

With shrinking dimensions of various integrated circuit components, transistors such as field-effect transistors (FETs) have experienced dramatic improvements in both performance and power consumption. These improvements may be largely attributed to the reduction in dimensions of components used therein, which in general translate into reduced capacitance, resistance, and increased through-put current from the transistors. Metal oxide semiconductor field-effect transistors (MOSFETs) are well suited for use in high-density integrated circuits. As the size of MOSFETs and other devices decreases, the dimensions of source/drain regions, channel regions, and gate electrodes of the devices, also decrease.

FinFET, nanosheet and vertical transport FETs have been under development for possible use in tight pitch applications. Nanosheet FETs include multiple channel layers, each channel layer being separated by a gate stack including a layer of electrically conductive gate material and a gate dielectric layer. The gate stacks wrap around all sides of the channel layers, thereby forming a gate-all-around (GAA) structure. Epitaxial regions on the ends of the nanosheet channel layers form source/drain regions of the nanosheet FETs. Spacers are employed for electrically isolating the gates from the source/drain regions of nanosheet transistors.

BRIEF SUMMARY

An exemplary monolithic semiconductor structure includes a semiconductor substrate and a vertical stack extending from the semiconductor substrate, The vertical stack includes a top set of nanosheet channel layers, a bottom set of nanosheet channel layers, and a dielectric spacer therebetween. A top dielectric sidewall spacer is on a first side of the vertical stack and adjoins the top set of nanosheet channel layers and a first portion of the dielectric spacer. A bottom dielectric sidewall spacer is on a second side of the vertical stack and adjoins the bottom set of nanosheet channel layers and a second portion of the dielectric spacer. A first pocket is on the first side of the vertical stack and a second pocket is on the second side thereof. A first gate stack of the semiconductor structure includes a gate dielectric layer and a first metal gate layer adjoining the gate dielectric layer. The first metal gate layer extends within the first pocket and between the nanosheet channel layers within the bottom set of the nanosheet channel layers, the top dielectric sidewall spacer being positioned between the top set of nanosheet channel layers and the first gate stack. A second gate stack comprising the gate dielectric layer and a second metal gate layer adjoins the gate dielectric layer, the second metal gate layer extending within the second pocket and between the nanosheet channel layers within the top set of the nanosheet channel layers. The bottom dielectric sidewall spacer is between the bottom set of nanosheet channel layers and the second gate stack. First source/drain regions having a first conductivity type and adjoin the bottom nanosheet channel layers and second source/drain regions having a second conductivity type adjoin the top nanosheet channel layers. The second conductivity type is opposite to the first conductivity type. A metal strap electrically connects the first metal gate layer and the second metal gate layer.

A second monolithic semiconductor structure includes a semiconductor substrate and a vertical stack extending from the semiconductor substrate. The vertical stack includes a top set of nanosheet channel layers, a bottom set of nanosheet channel layers, and a dielectric spacer between the top set of nanosheet channel layers and the bottom set of nanosheet channel layers. A top dielectric sidewall spacer is on a first side of the vertical stack and adjoins the top set of nanosheet channel layers and a first portion of the dielectric spacer. A horizontally extending separator layer is on a second side of the vertical stack and is horizontally aligned with the dielectric spacer within the vertical stack. A first pocket is on the first side of the vertical stack and a second pocket is on the second side of the vertical stack, the second pocket being above the horizontally extending separator layer. A first gate stack including a gate dielectric layer and a first metal gate layer adjoins the gate dielectric layer. The first metal gate layer extends within the first pocket and between the nanosheet channel layers within the bottom set of the nanosheet channel layers, the top dielectric sidewall spacer being positioned between the top set of nanosheet channel layers and the first gate stack. A second gate stack includes the gate dielectric layer a second metal gate layer that adjoins the gate dielectric layer. The second metal gate layer extends within the second pocket and between the nanosheet channel layers within the top set of the nanosheet channel layers. First source/drain regions having a first conductivity type adjoin the bottom nanosheet channel layers and second source/drain regions having a second conductivity type and adjoin the top nanosheet channel layers, the second conductivity type being opposite to the first conductivity type.

A method of fabricating a stacked nanosheet transistor architecture includes obtaining a monolithic structure including: a semiconductor substrate; a vertical stack extending from the semiconductor substrate, the vertical stack including bottom nanosheet channel layers, top nanosheet channel layers, a dielectric spacer between the bottom nanosheet channel layers and the top nanosheet channel layers, a dielectric cap above the top nanosheet channel layers, and sacrificial nanosheet semiconductor layers arranged in alternating sequence with the top nanosheet channel layers and with the bottom nanosheet channel layers, a top source/drain region having a first conductivity type adjoining the top nanosheet channel layers; a bottom source/drain region having a second conductivity type adjoining the bottom nanosheet channel layers, the second conductivity type being opposite from the first conductivity type; a first pocket on a first side of the vertical stack; a second pocket on a second side of the vertical stack; a sacrificial gate layer within the first pocket and the second pocket; a top dielectric sidewall spacer on a sidewall of a top portion of the vertical stack comprising the top nanosheet channel layers and the dielectric cap; and an isolation layer adjoining the sacrificial gate layer and positioned between the second pocket and the bottom nanosheet channel layers. The method further includes removing the sacrificial gate layer from the first pocket and from the second pocket, removing the sacrificial nanosheet semiconductor layers, thereby forming spaces between each of the top nanosheet channel layers and each of the bottom nanosheet channel layers, forming a gate dielectric layer on the top nanosheet channel layers and the bottom nanosheet channel layers, depositing a first gate metal layer within the first pocket, the second pocket and between the top nanosheet channel layers and the bottom nanosheet channel layers, removing the first gate metal layer from a gate region including: one of the first pocket and the second pocket, and the spaces between one of the top nanosheet channel layers and the bottom nanosheet channel layers; and depositing a second gate metal layer in the gate region.

Techniques and structures as disclosed herein can provide substantial beneficial technical effects. By way of example only and without limitation, one or more embodiments may provide one or more of the following advantages:

Manufacturing flexibility to elect connected or non-connected N-P gates in a stacked FET architecture;

Multi-Vt (threshold voltage) in stacked FET architecture;

Optional strapping of metal gates;

Facilitates use of different workfunction metals in stacked FET architecture.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 35 is a schematic, cross-sectional view of the structure shown in FIG. 34A following removal of sacrificial semiconductor layers between nanosheet channel layers within the nanosheet stack.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Stacked nanosheet FET designs provide advantages in structural scaling of logic and memory devices. Logic cells tend to have N-P gates connected together. Multiplexer (MUX) and stacked SRAM designs, for example, have unconnected N-P gates. The flexibility to choose whether or not to connect such gates based on design requirements in a stacked FET architecture is beneficial. Multiple threshold voltages (Vt) in a stacked FET architecture can also be design requirements in electronic applications. NFET and PFET devices may require the use of different workfunction metals (WFMs) in forming the gates thereof. The creation of separate RMG "pockets" for top and bottom nanosheet FETs, as described below, and the option to electrically connect the N-gate with the P-gate with metal strapping, allows such benefits to be attained.

Figure 2:
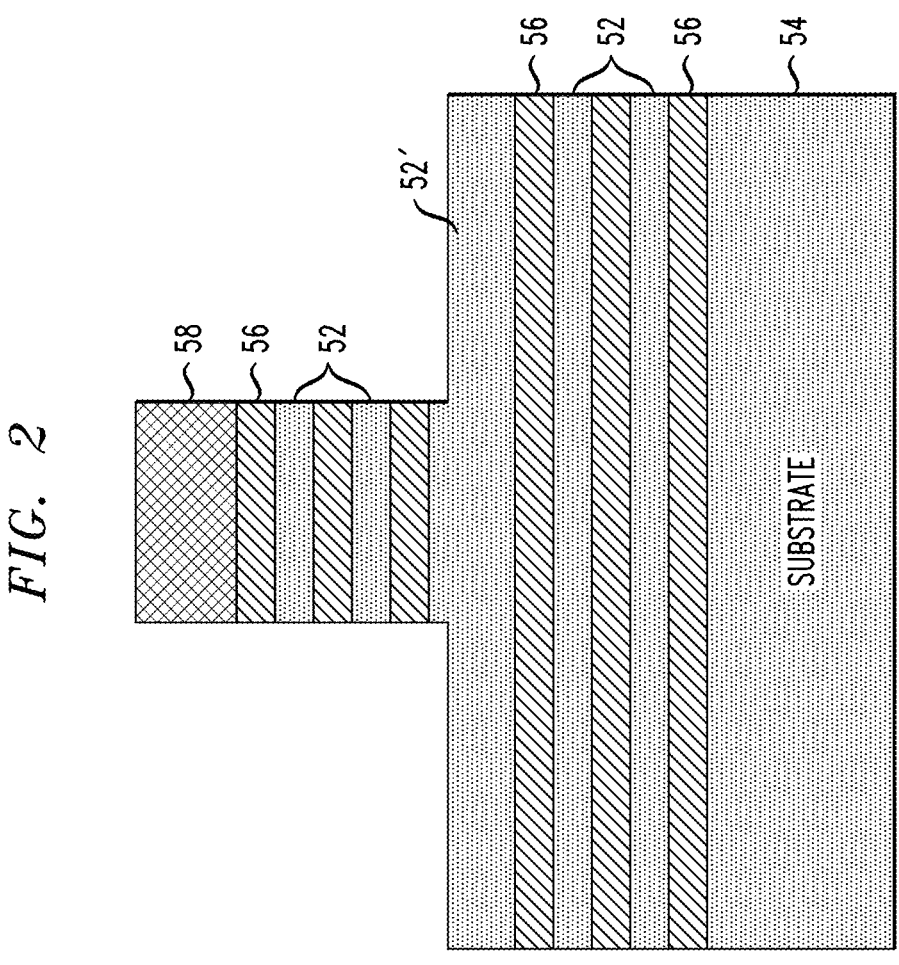
FIG. 2 is a schematic, cross-sectional view along the x cross section showing a nanosheet stack following a directional etch through a portion of the nanosheet stack.
Figure 1:
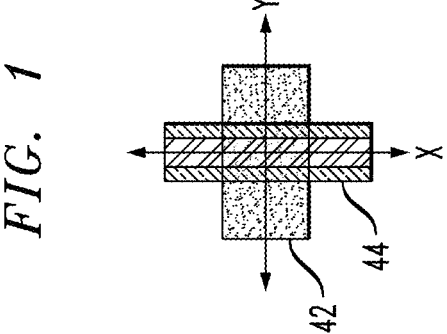
FIG. 1 is a top plan view of a layout including a dummy gate over a nanosheet stack, showing x and y cross sections according to an exemplary embodiment.

A first exemplary sequence of steps that may be employed for the removal of metal from a region of field-effect transistor structures is shown in FIG. 2 and subsequent figures. The schematic top plan view of FIG. 1 provides perspective of the orientations of x and y cross sections with respect to a fin 42 comprising a nanosheet stack and a sacrificial gate 44 extending perpendicularly with respect to the fin.

The monolithic structure shown in FIG. 2 includes a stack of nanosheets including semiconductor channel layers 52 formed on a substrate 54. The nanosheets can be formed on a semiconductor-on-insulator substrate or on a bulk semiconductor substrate such as a bulk silicon substrate. In one or more exemplary embodiments, the semiconductor nanosheet (channel) layers each have a thickness in the range of four to ten nanometers (4-10 nm). The number of semiconductor (channel) layers in the semiconductor layer stack may vary depending on the desired uses and capabilities of the nanosheet transistors to be fabricated. The semiconductor channel layers 52 are essentially monocrystalline silicon layers and are spaced ten to twenty nanometers (10-20 nm) apart in some embodiments. The width of each semiconductor channel layer 52 in the top, fin-like portion of the exemplary monolithic structure is fifteen nanometers (15 nm) or greater (as viewed in the x cross section) some embodiments. The dimensions of the channel layers and the vertical spacing of channel layers should be considered exemplary as opposed to limiting. One of the silicon layers is substantially thicker than the others in the exemplary embodiment. The relatively thick silicon layer 52' is about forty nanometers (40 nm) thick in one embodiment.

Silicon and silicon germanium layers 52, 56, respectively, can be epitaxially grown on a semiconductor substrate in alternating sequence to obtain a layered stack having the desired number of silicon (channel) layers. The terms "epitaxially growing and/or depositing" and "epitaxially grown and/or deposited" mean the growth of a semiconductor material on a deposition surface of a semiconductor material in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

The monolithic structure illustrated in FIG. 2 is obtained by growing silicon and silicon germanium nanosheet layers in alternating sequence on the substrate 54. The sacrificial silicon germanium layers 56, which are replaced by metal gate and gate dielectric materials later in the process, may have a thickness in the range of six to twenty nanometers (6-20 nm). The dimension ranges of the channel layers and sacrificial silicon germanium layers should be considered exemplary as opposed to limiting. The silicon germanium layers 56 may have the composition $Si_{1-x}Ge_x$ where x is between 0.2 and 0.8 to allow selective etching with respect to silicon. Using a patterned hard mask (for example, silicon nitride), an initial reactive ion etch (ME) is performed down to the relatively thick silicon layer 52' to obtain a top multi-layer, fin-like semiconductor structure having a dielectric cap 58 formed from the hard mask. The multi-layer, fin-like semiconductor structure extends vertically from the relatively thick silicon layer 52', as shown in FIG. 2 at this stage of the process. The silicon and silicon germanium layers formed beneath the relatively thick silicon layer 52' form a bottom multi-layer semiconductor structure.

Figure 3:
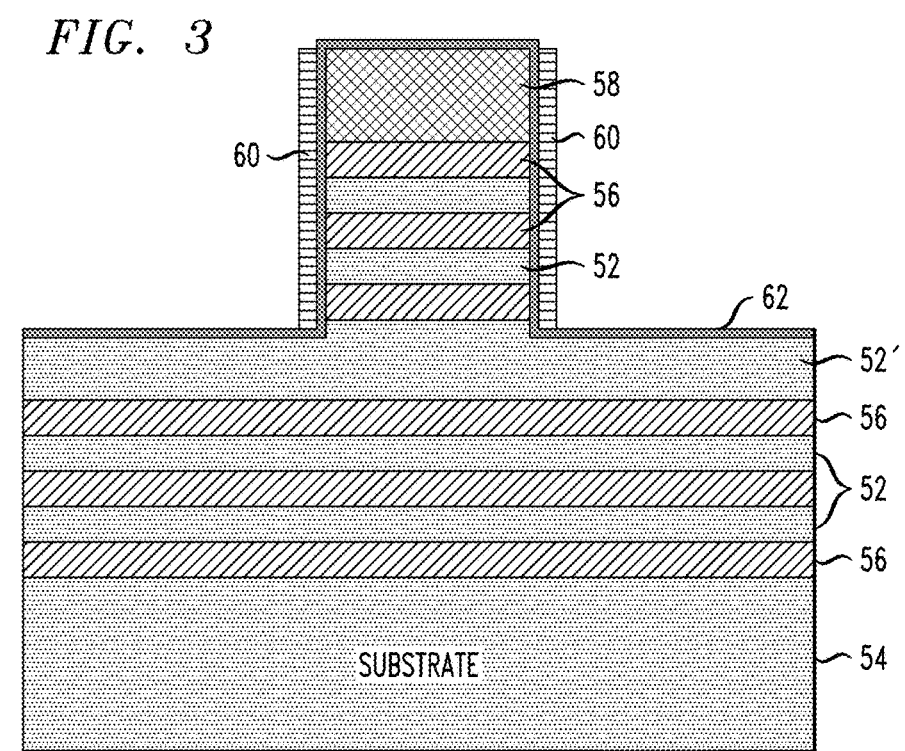
FIG. 3 is a schematic, cross-sectional view thereof following deposition of a multilayer liner and partial etch-back of a portion of the multilayer liner.

A multi-layer dielectric liner is formed on the monolithic structure subsequent to the initial RIE process. In an exemplary embodiment, an oxide liner is conformally deposited on the monolithic structure followed by deposition of a silicon nitride liner. The silicon nitride liner is selectively etched back to remove horizontal portions thereof, thereby forming vertical, top sidewall spacers 60 on the sidewalls of the multi-layer, fin-like semiconductor structure as shown in FIG. 3. The oxide liner 62 remains on both the horizontal and vertical surfaces thereof.

Figure 4:
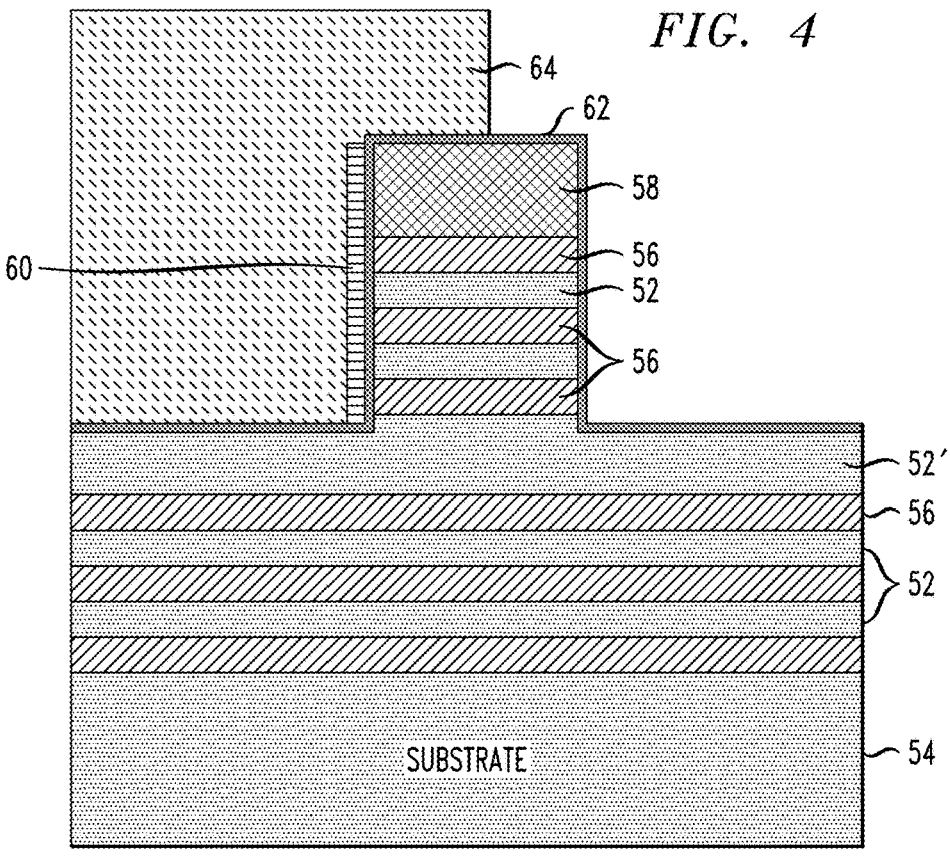
FIG. 4 is a schematic, cross-sectional view thereof following removal of a portion of the multi-layer liner on one side of the nanosheet stack.

Referring to FIG. 4, the top sidewall spacer 60 is removed from one side of the multi-layer, fin-like structure. A patterned mask 64 is formed over a first side of the multi-layer, fin-like structure while the second side thereof is unprotected. Suitable materials for the mask 64 include, but are not limited to, OPL (organic planarization layer) material. Standard lithography and etching techniques can be employed to pattern the mask. A lithographic stack (not shown) including photoresist and anti-reflective coating may be employed to pattern the mask in some embodiments. The mask 64 is removed by ashing or other suitable process following the removal of the unprotected sidewall spacer. The resulting multi-layer, fin-like semiconductor structure includes a sidewall spacer 60 on only one side thereof following this stage of the process.

Figure 5:
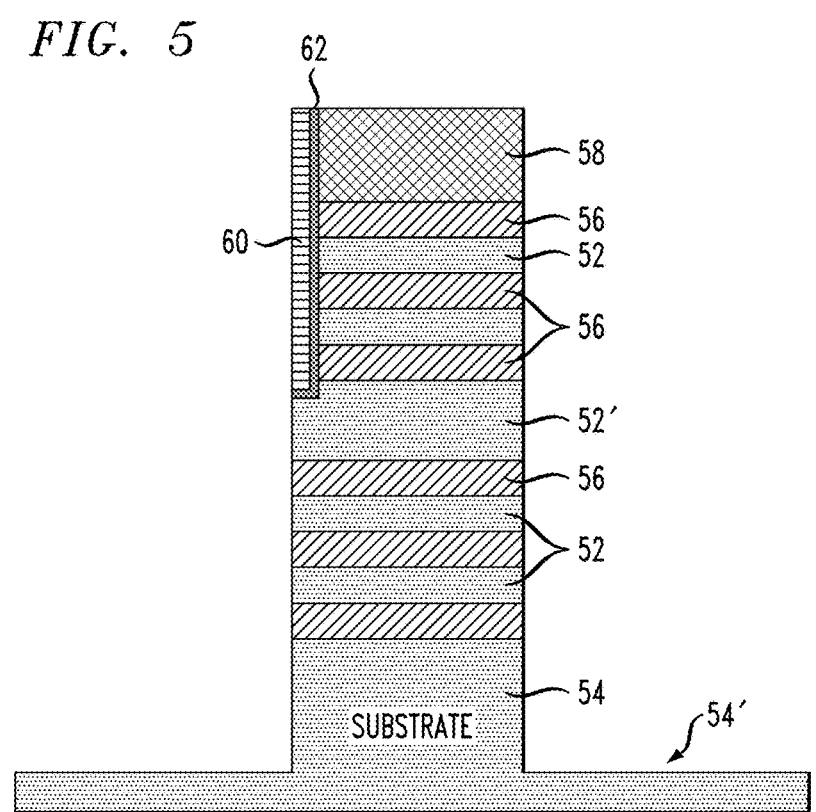
FIG. 5 is a schematic, cross-sectional view thereof following a further directional etch through the nanosheet stack and a portion of an underlying substrate.

Exposed portions of the oxide liner 62 are removed and a further reactive ion etch is employed to remove semiconductor material beneath the top, multi-layer, fin-like semiconductor structure. A top portion of the substrate 54 is also removed to form cavities 54' therein, thereby obtaining a structure as schematically illustrated in FIG. 5. The layers of silicon and silicon germanium beneath the relatively thick silicon layer 52' are wider than those above it due to the presence of the top sidewall spacer 60 and oxide liner 62 that adjoin the hard mask (cap) 58 as well as the upper channel layers 52.

Figure 6:
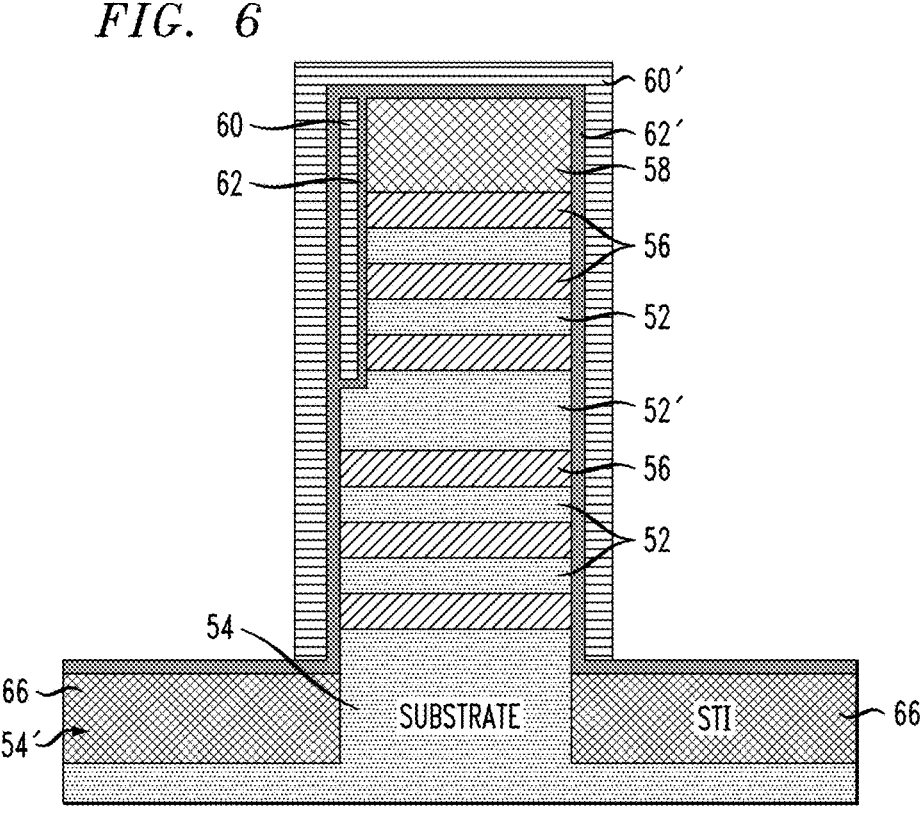
FIG. 6 is a schematic, cross-sectional view showing the structure depicted in FIG. 5 following formation of shallow trench isolation regions and deposition of conformal liners.

Shallow trench isolation (STI) regions 66 are formed within the cavities 54' in the substrate 54 to provide electrical isolation of active regions comprising neighboring transistors or other devices that may be formed on the substrate. Silicon dioxide or other suitable dielectric material may be deposited to form such regions. As further shown in FIG. 6, a second oxide liner 62' is formed on the resulting structure, covering the nanosheet stack and the STI regions. A conformal dielectric layer 60' such as a silicon nitride layer is deposited over the second oxide liner 62'. Horizontal portions of the conformal dielectric layer 60' extending over the STI regions 66 are removed.

Figure 7:
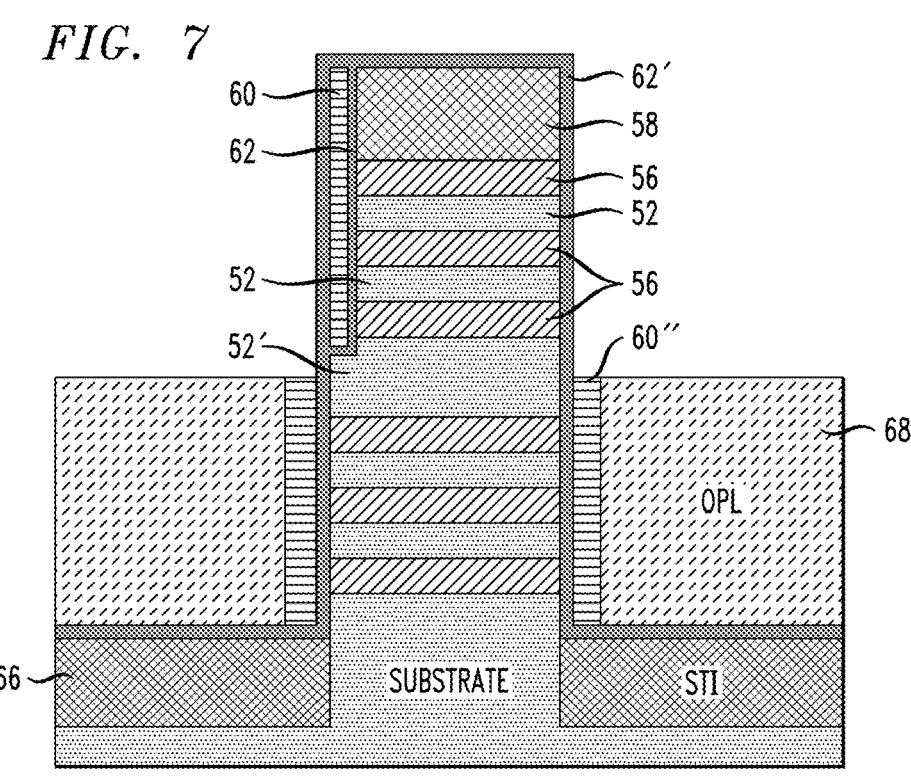
FIG. 7 is a schematic, cross-sectional view thereof following partial removal of the conformal liner.

Referring to FIG. 7, bottom sidewall spacers 60'' are formed from the conformal dielectric layer 60'. A mask 68 such as an organic planarization layer is deposited on the structure and recessed to a height wherein the top surface of the mask is between the levels of the top and bottom surfaces of the relatively thick silicon layer 52'. The portions of the conformal dielectric layer 60' above the mask 68 are removed, leaving the bottom sidewall spacers 60'' and the second oxide layer 62'. The mask 68 is then removed by ashing or other suitable technique.

Figure 8:
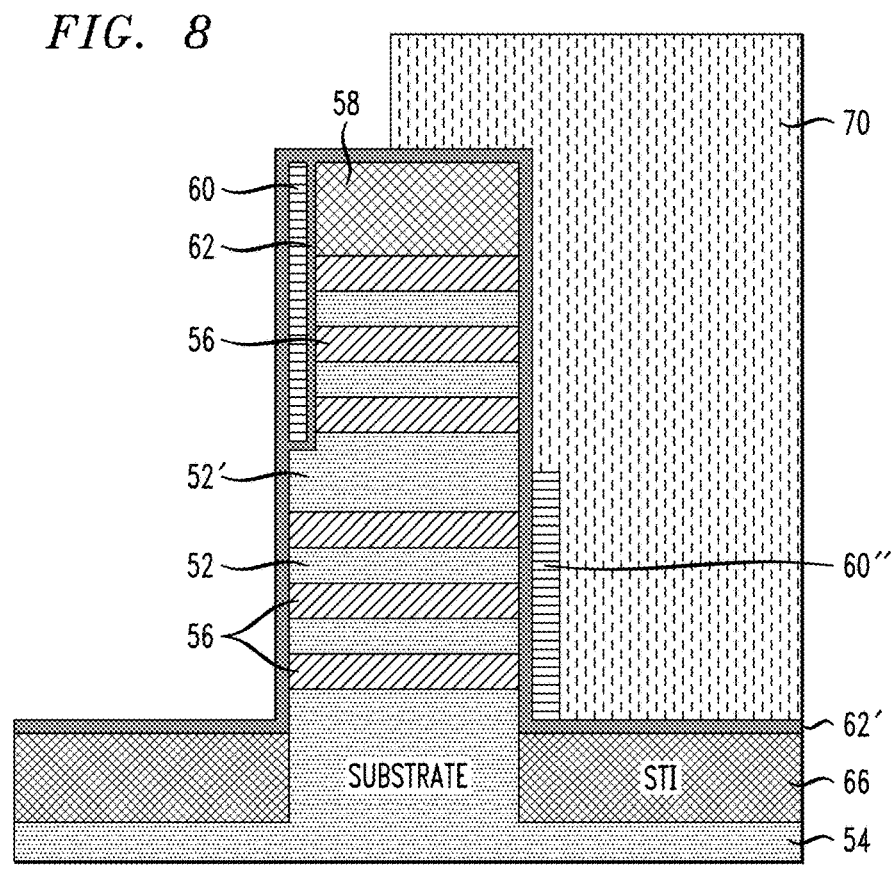
FIG. 8 is a schematic, cross-sectional view thereof following removal of a further portion of the conformal liner.

One of the bottom sidewall spacers 60'' is removed from the side of the structure including the top sidewall spacer 60. Referring to FIG. 8, a sidewall mask 70 such as an organic planarization layer is deposited and patterned such that it protects the bottom sidewall spacer 60'' on one side of the structure while leaving the sidewall spacer on the opposite side exposed. A directional (anisotropic) etch is then employed to remove the exposed bottom sidewall spacer. The etch is selective and leaves the second oxide liner 62' intact. The sidewall mask 70 is removed following the directional etch.

Figure 9B:
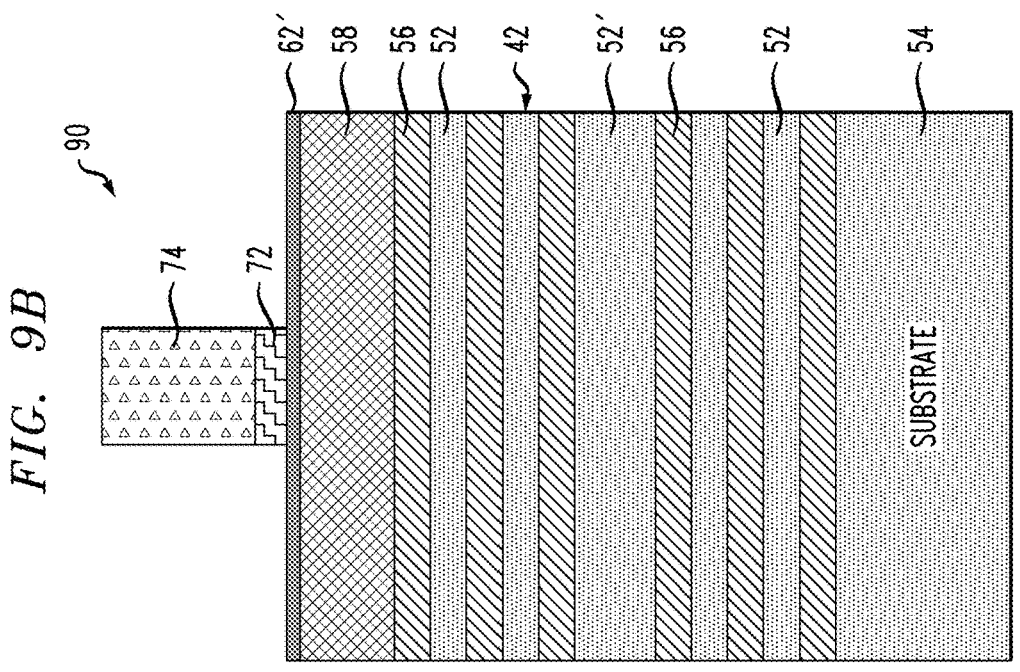
FIG. 9B is a schematic, cross-sectional view thereof, taken along the y cross section, of the structure shown in FIG. 9A.
Figure 9A:
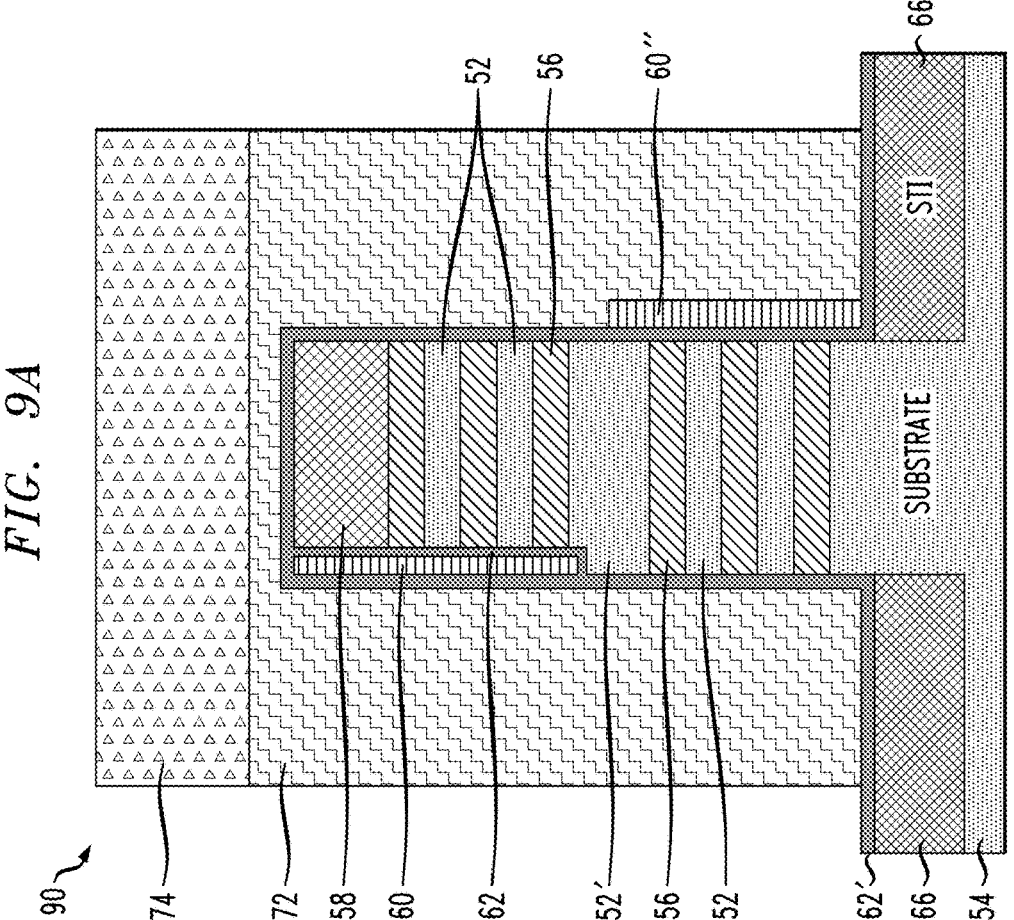
FIG. 9A is a schematic, cross-sectional view thereof, taken along the x cross section, following deposition of a sacrificial layer on the structure depicted in FIG. 8 and a directional etch of the sacrificial layer.

A sacrificial gate layer 72 is formed over the stack of nanosheet layers and the STI regions 66. The sacrificial gate layer 72 may comprise, for example, amorphous silicon (a-Si) or polycrystalline silicon (polysilicon). Sacrificial gate material used to form the sacrificial gate layer 72 may be formed using, for example, physical vapor deposition (PVD), chemical vapor deposition (CVD), plasma enhanced chemical vapor deposition (PECVD), inductively coupled plasma chemical vapor deposition (ICP CVD), or any combination thereof. The sacrificial gate layer adjoins the oxide layer 62' and the bottom sidewall spacer 60''. A hard mask 74 (for example, $SiN_x$ or a combination of $SiN_x$ and $SiO_2$)) is deposited and patterned on the top surface of the sacrificial gate layer 72. The sacrificial gate layer is then subjected to a reactive ion etch down to the oxide layer 62' on the STI regions 66. A structure 90 as schematically illustrated in FIG. 9A and FIG. 9B is obtained.

Figure 10B:
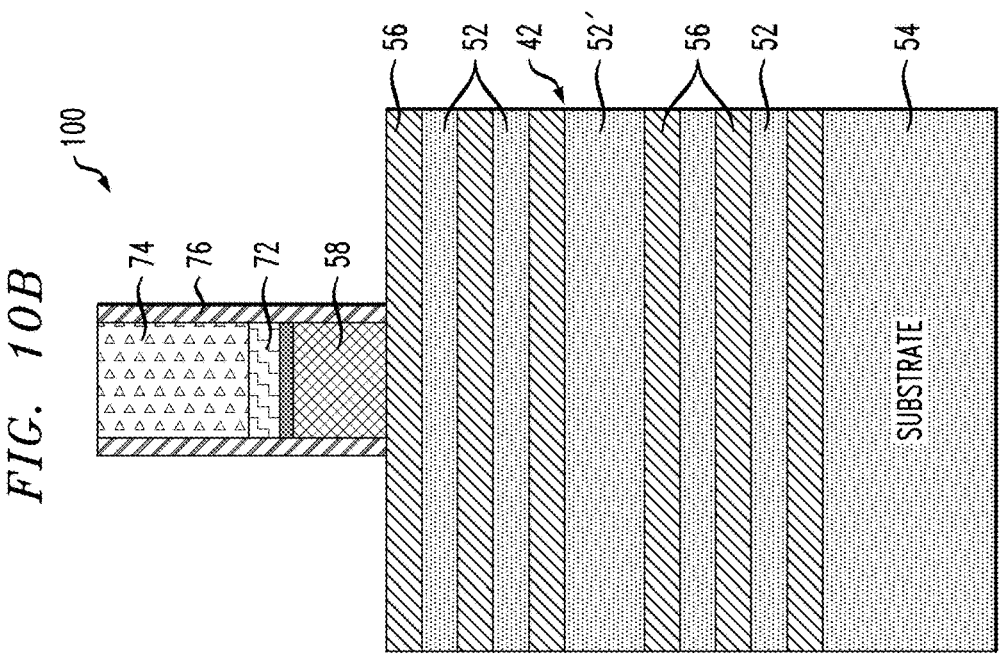
FIG. 10B is a schematic, cross-sectional view, taken along the y cross section, of the structure shown in FIG. 10A.
Figure 10A:
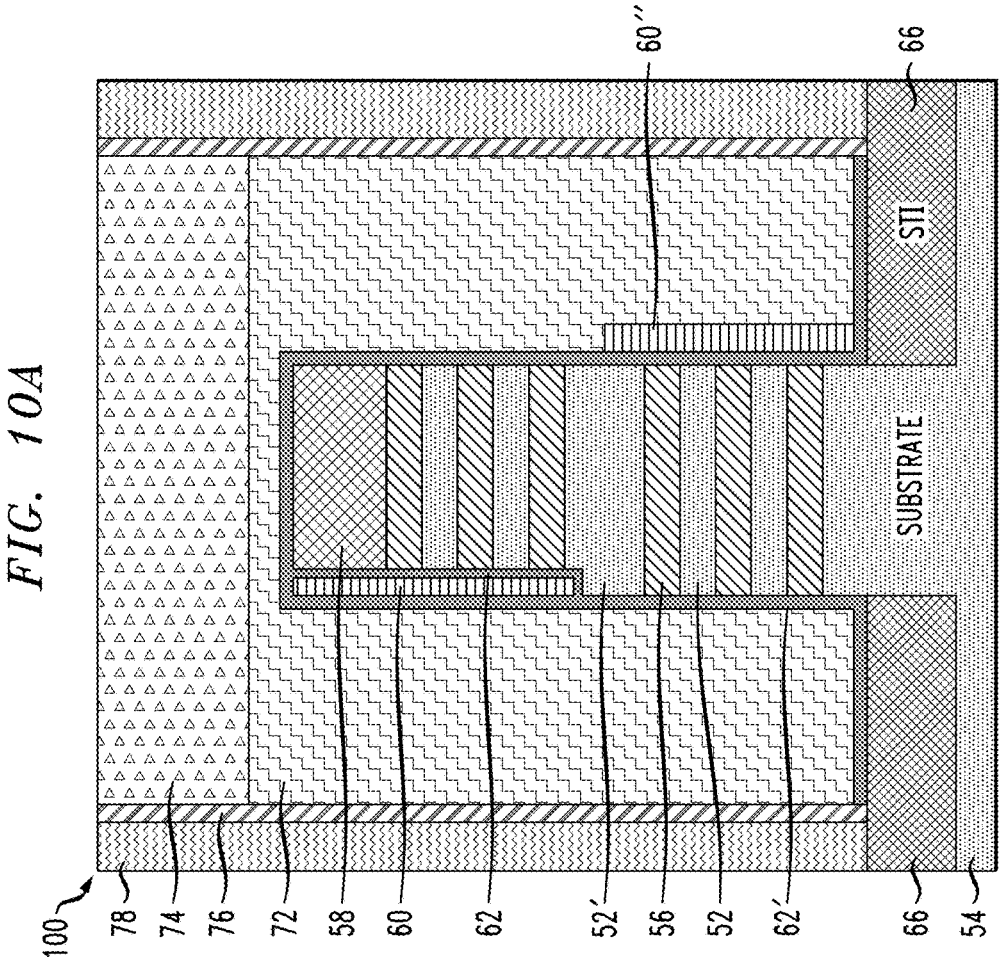
FIG. 10A is a schematic, cross-sectional view of the structure shown in FIG. 11A following fin hard mask removal and spacer formation.

Referring to FIG. 10A and FIG. 10B, directional etching is employed to remove portions of the oxide layer 62' and the fin mask (cap) 58 beneath the hard mask 74, stopping at the top germanium layer 56 of the multi-layer, fin-like semiconductor structure. Dielectric sidewall gate spacers 76 are then formed on the hard mask 74 and underlying layers, including the sacrificial gate layer 72. The dielectric sidewall gate spacers may comprise, for example, SiN, SiBCN, SiOCN and/or SiCO, or other suitable dielectric materials. Such materials can be deposited using ALD (atomic layer deposition). A dielectric fill 78 such as low-k SiOx as shown in FIG. 10A is then deposited to obtain the schematically illustrate structure 100.

Figure 11:
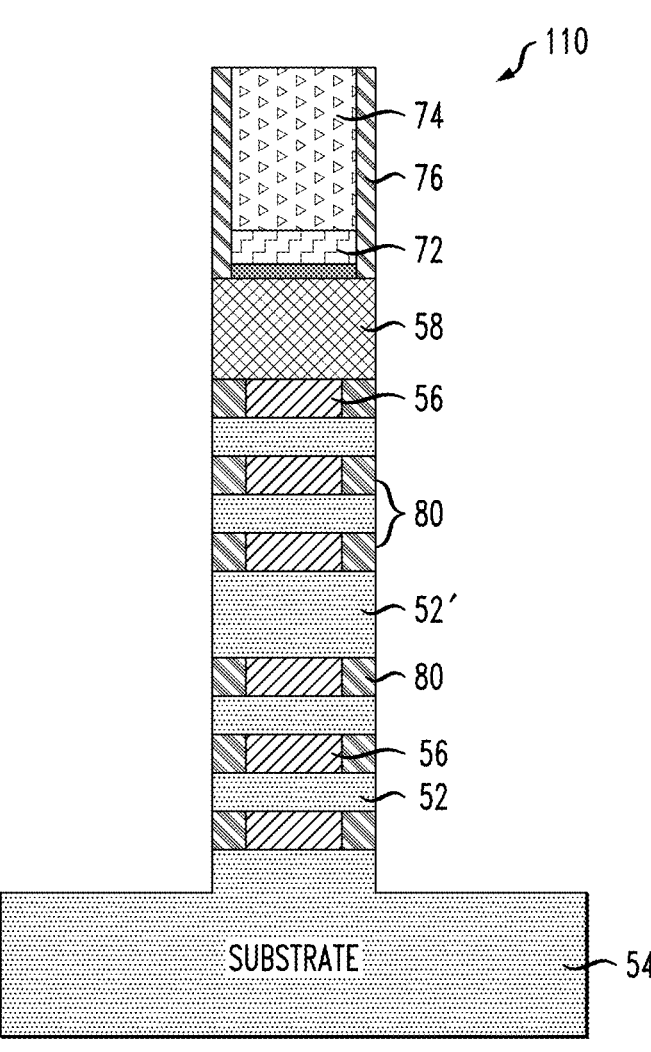
FIG. 11 is a schematic, cross-sectional view of the structure shown in FIG. 13B following a directional etch of the nanosheet stack.

Referring to FIG. 11, the stack of nanosheet semiconductor layers is subjected to a reactive ion etch down to the substrate 54. The resulting structure is subjected to a timed wet etching process to selectively recess the silicon germanium layers 56 within the stack of nanosheet semiconductor layers. Hydrogen chloride gas is employed in some embodiments to selectively remove silicon germanium, leaving the silicon nanosheet layers 52 and the relatively thick silicon layer 52' substantially intact. Alternatively, a wet etch process containing ammonia and hydroperoxide can be used to etch SiGe selective to other materials. Each exposed end of the silicon germanium layers 56 may be recessed by, for example, three to five nanometers (3-5 nm). The silicon germanium layers 56 have smaller widths than the widths of the silicon (channel) layers 52 following the timed etch. The stack of semiconductor layers accordingly includes indents between the end portions of each pair of silicon (channel) layers 52.

Dielectric spacer material is deposited in the trenches resulting from the reactive ion etch of the stack of semiconductor layers. The dielectric spacer material is etched back to form inner spacers 80 within each of the indents in the stack of nanosheet semiconductor layers. A selective reactive ion etch may be employed to remove the dielectric inner spacer material outside of the indents between silicon layers. A structure 110 as schematically illustrated in FIG. 11 may be obtained. The inner spacers 80 of the structure may comprise, for example, low-k dielectric material. Silicon oxynitride, SiBCN (silicon borocarbonitride), SiOCN (silicon oxycarbonitride), and/or SiOC (silicon oxycarbide) inner spacers may be formed in some embodiments. Relatively low-k silicon nitride-based materials, if used to form the inner spacers 80, can be selectively etched using, for example, phosphoric acid. Various techniques of forming inner spacers for nanosheet transistors have been discussed in the literature and continue to be developed. The particular materials and steps discussed with respect to spacer formation should accordingly be considered exemplary as opposed to limiting.

Figure 12B:
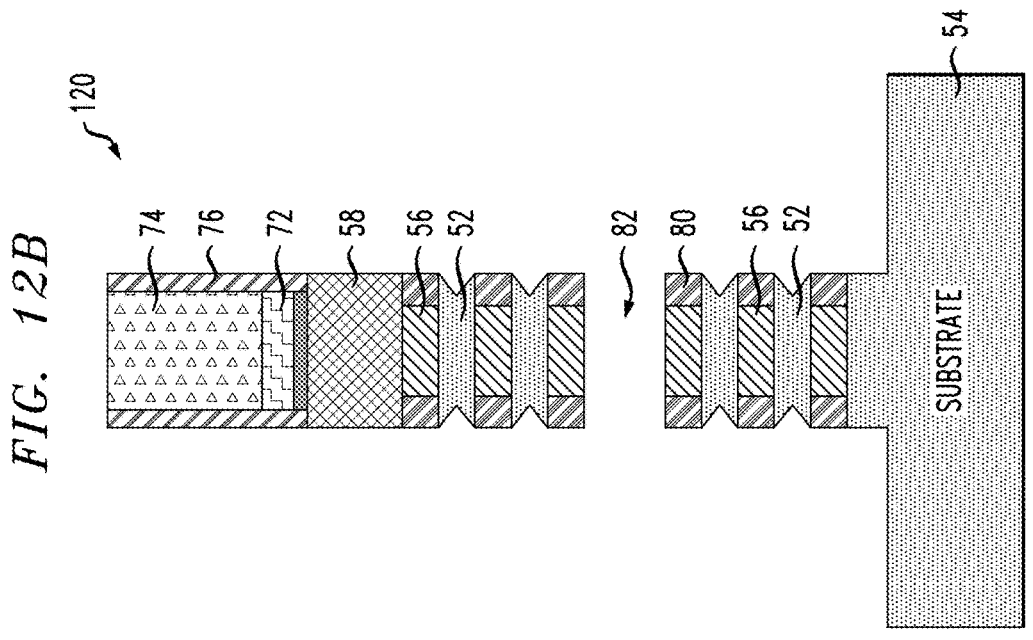
FIG. 12B is a schematic, cross-sectional view, taken along the y cross section, of the structure shown in FIG. 12A.
Figure 12A:
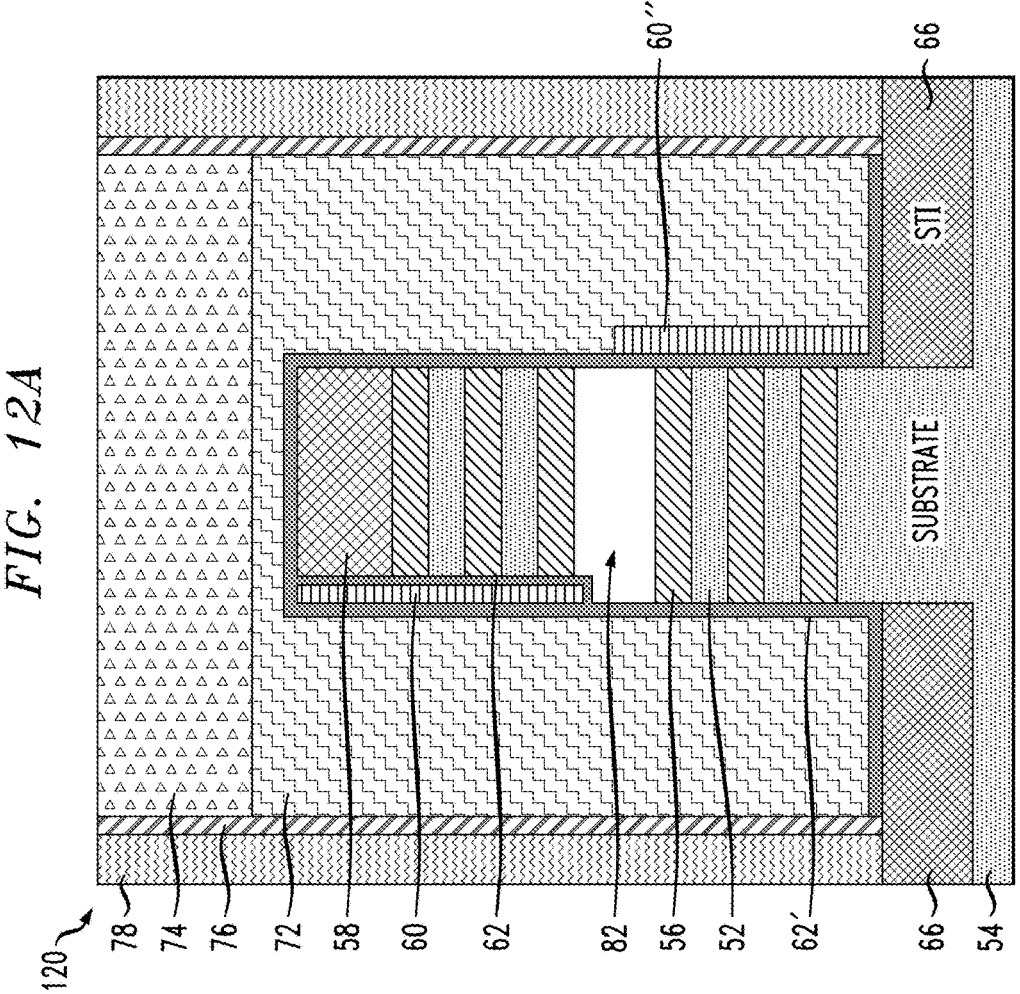
FIG. 12A is a schematic, cross-sectional view, taken along the x cross section, following removal of a layer within the nanosheet stack to form a space therein.

The relatively thick silicon layer 52' is removed to obtain a structure 120 as schematically illustrated in FIG. 12A and FIG. 12B. Ammonium hydroxide ($NH_4OH$) or tetramethylammonium hydroxide (TMAH) may be employed for such removal as their selectivity to silicon germanium is high. While etching of the relatively thin silicon channel layers 52 will also occur, such etching is limited as etching on the (111) plane is slow. The end portions of the silicon channel layers form faceted surfaces that function as etch stops. The lengths of the silicon channel layers 52 are sufficient to allow the formation of such facets, leaving the interior portions of the silicon channel layers intact. The etching of the thicker silicon layer 52' is not self-limiting and is completely removed, leaving a space 82 between portions of the multilayer nanosheet stack. An exemplary silicon layer 52' having a thickness of about forty nanometers supports a gate length Lg up to about thirty nanometers in the finished product.

Figure 13B:
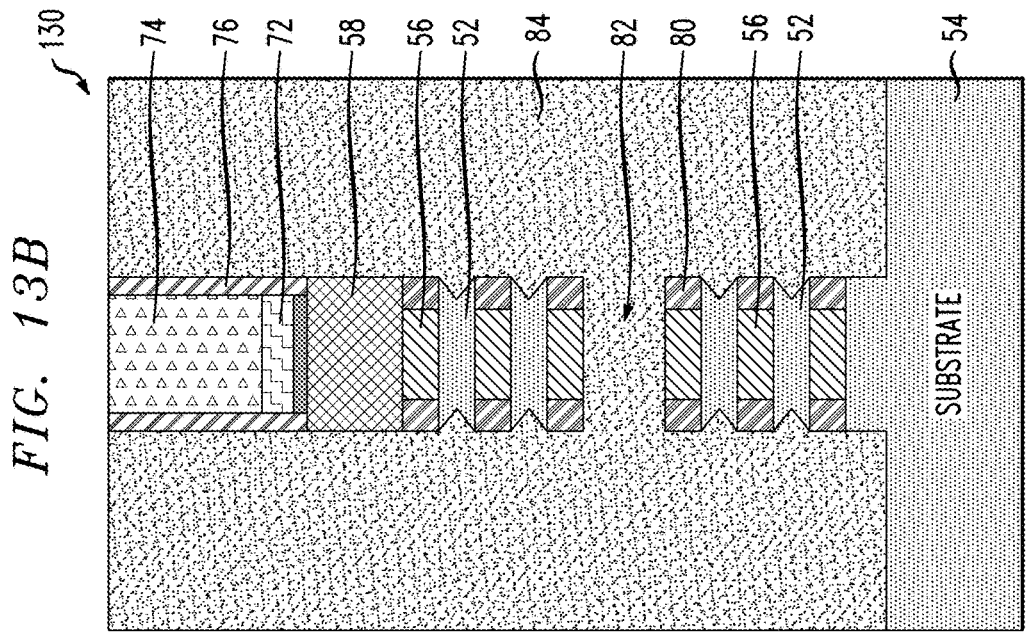
FIG. 13B is a schematic, cross-sectional view, taken along the y cross section, of the structure shown in FIG. 13A.
Figure 13A:
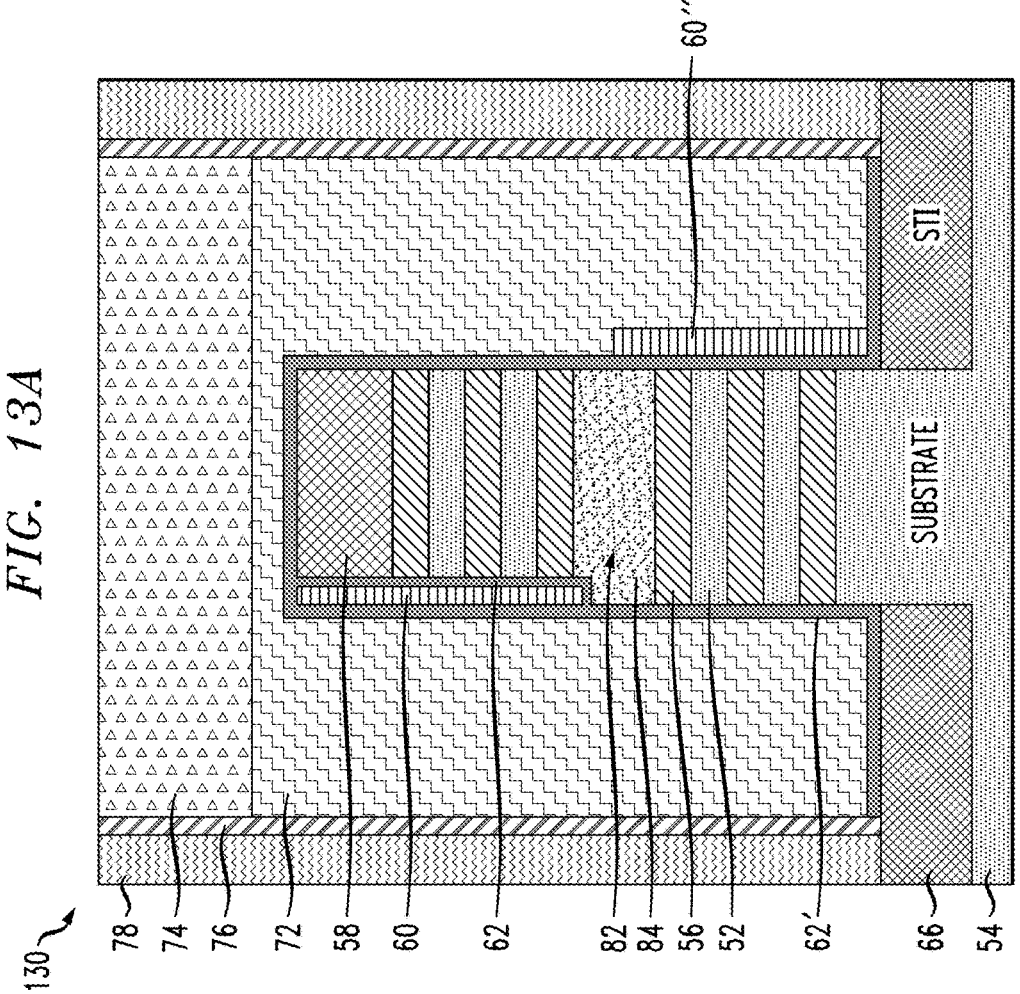
FIG. 13A is a schematic, cross-sectional view showing the structure of FIG. 15A following deposition of an electrically isolating fill layer.
Figure 14:
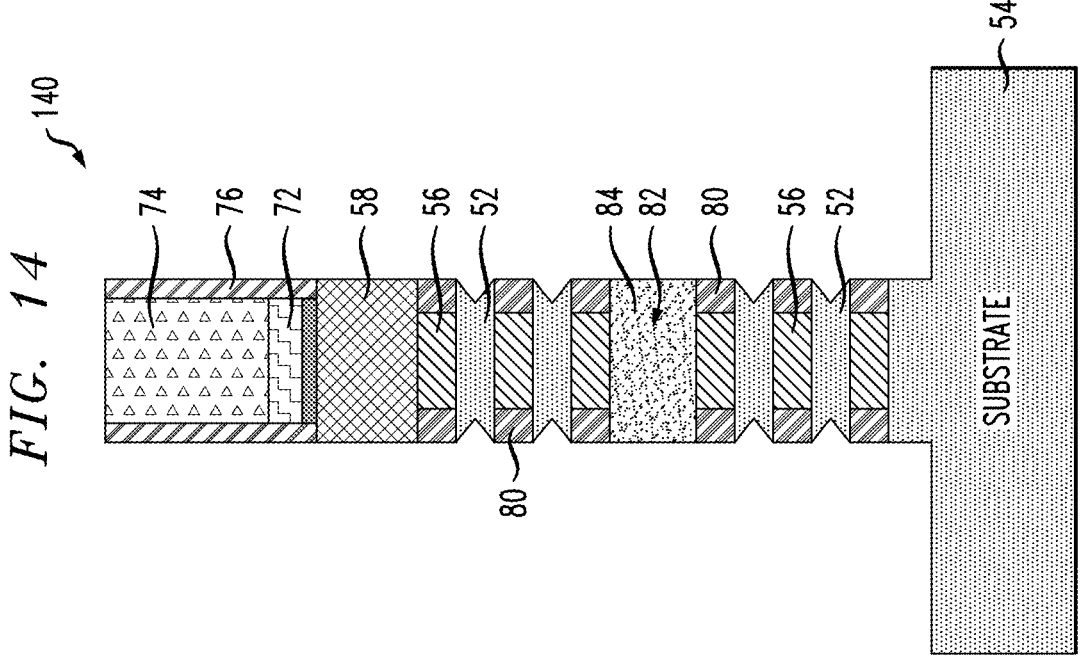
FIG. 14 is a schematic, cross-sectional view of the structure shown in FIG. 13B following a directional etch of the electrically isolating fill layer.

Referring to FIG. 13A and FIG. 13B, a dielectric fill layer 84 is deposited on the resulting structure 120. A silicon nitride or silicon oxide liner may optionally be deposited prior to deposition of the dielectric fill layer. In an exemplary embodiment, the dielectric fill layer 84 comprises a flowable oxide deposited using a CVD process. The dielectric fill layer 84 occupies the region adjoining the sacrificial gate layer 72 and fills the space 82 previously containing the relatively thick silicon layer 52'. The structure 130 as schematically illustrated in FIG. 13A and FIG. 13B is subjected to a reactive ion etch to remove the portions of the dielectric fill layer 84 outside the space 82 between sets of semiconductor nanosheet layers. As shown in FIG. 14, the remaining portion of the dielectric fill layer 84 forms a dielectric spacer between the sets of semiconductor nanosheet layers. The resulting structure 140 accordingly includes a semiconductor nanosheet stack including a top portion that is electrically isolated from the bottom portion of the stack.

Source/drain regions 86-1, 86-2 are epitaxially grown on the exposed edges of the silicon channel layers 52. Dopants may be incorporated in situ using appropriate precursors, as known in the art. By "in-situ" it is meant that the dopant that dictates the conductivity type of a doped layer is introduced during the process step, for example epitaxial deposition, that forms the doped layer. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. In a silicon-containing substrate, examples of n-type dopants, i.e., impurities, include but are not limited to antimony, arsenic and phosphorous. Exemplary epitaxial growth processes that are suitable for use in forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). An nFET region(s) includes transistors having n-type source/drain regions while the pFET region(s) includes p-type source/drain regions. Source/drain regions of nanosheet devices are typically grown prior to the RMG process.

Figure 15:
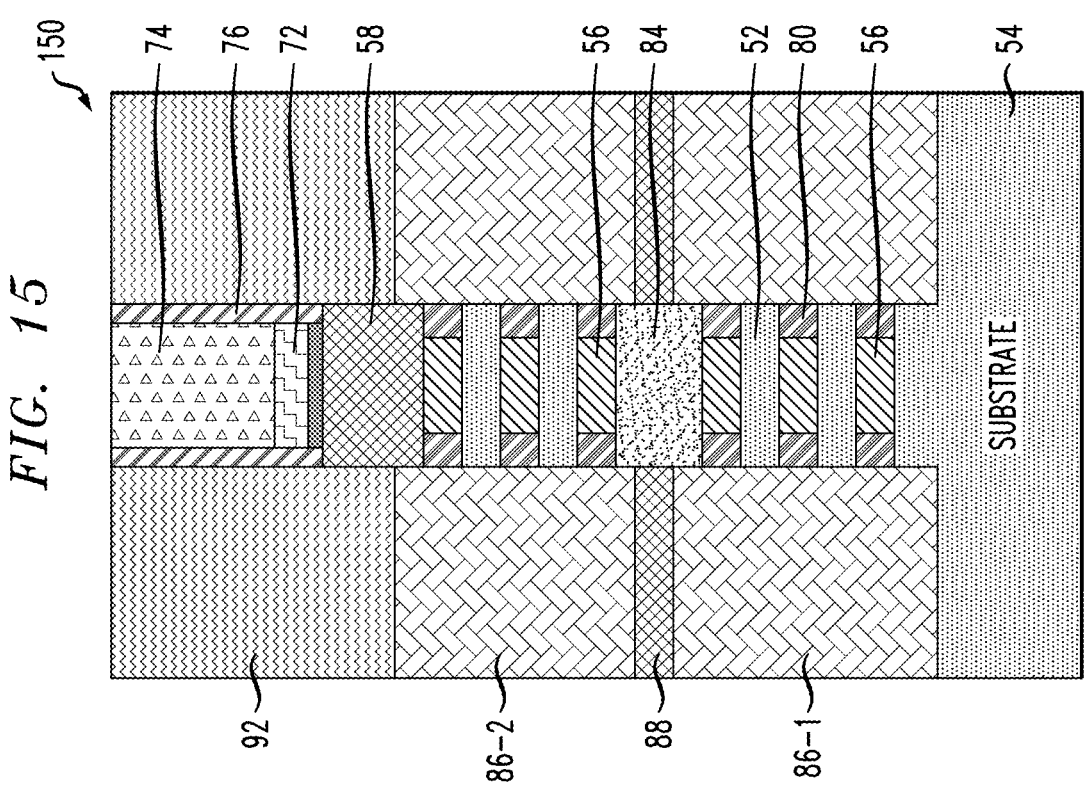
FIG. 15 is a schematic, cross-sectional view of the structure shown in FIG. 14 following formation of epitaxial source/drain regions.

After growth of the bottom source/drain region 86-1 on the silicon channel layers 52 within the bottom portion of the semiconductor nanosheet stack, a dielectric layer 88 (for example, silicon nitride, is deposited on the top surface thereof and recessed down to a level beneath the top surface of the adjoining dielectric fill layer 84 within the space 82. The bottom surface of the dielectric layer 88 is above the bottom surface of the dielectric fill (spacer) layer 84, as shown in FIG. 15. The top source/drain region 86-2 is then grown on the end portions of the silicon channel layers 52 within the top portion of the semiconductor nanosheet stack. (The faceted end portions of the silicon channel layers 52 are not shown in FIG. 15 and further figures, but would be present if the techniques as described above have been employed.) In one or more embodiments, the conductivity type of the top source/drain region 86-2 is opposite from the conductivity type of the bottom source/drain region 86-1. A dielectric top layer 92, for example a low-k interlayer dielectric such as porous organosilicate glass, is deposited over the source/drain regions and planarized to obtain a structure 150 as schematically illustrated in FIG. 15.

Figure 16B:
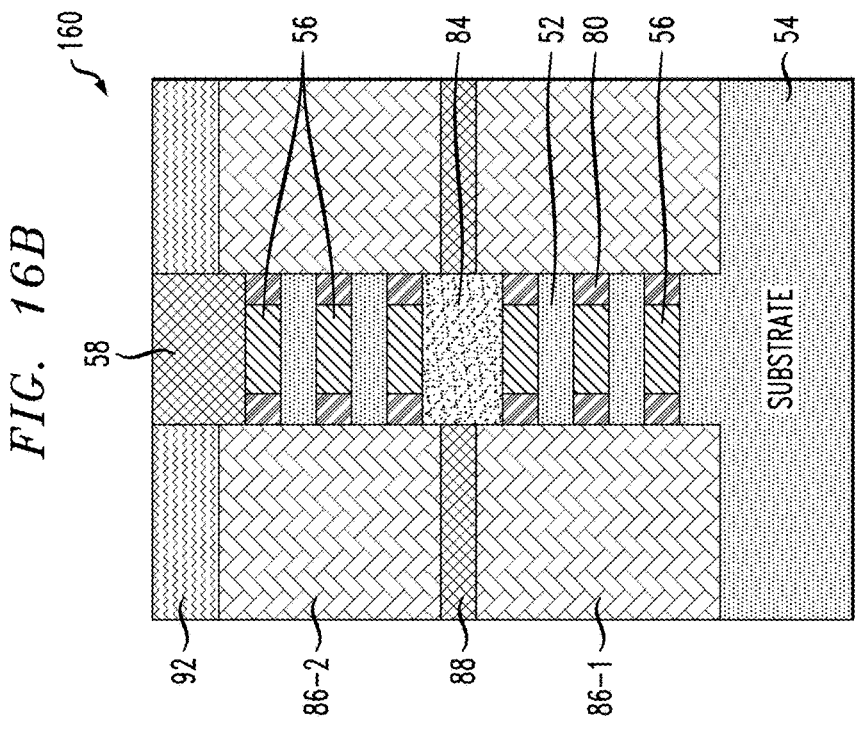
FIG. 16B is a schematic, cross-sectional view of the structure shown in FIG. 16A, taken along the y cross section.
Figure 16A:
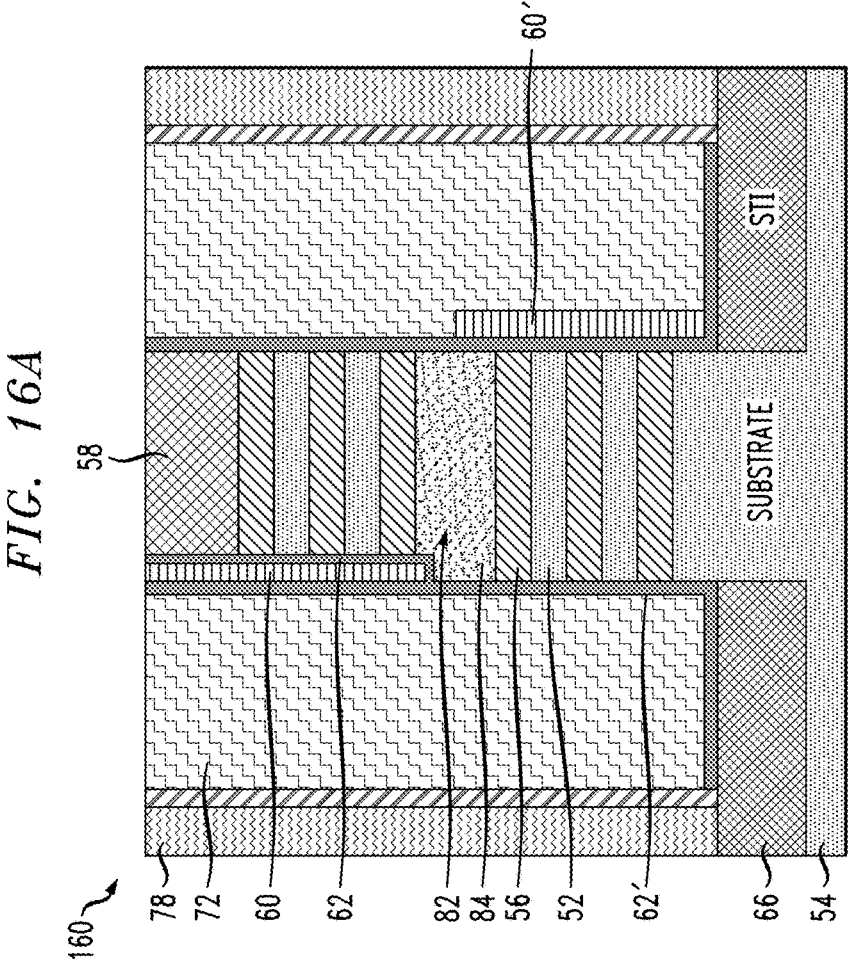
FIG. 16A is a schematic, cross-sectional view of the structure shown in FIG. 15, taken along the x cross section, following exposure of the sacrificial layer.
Figure 17:
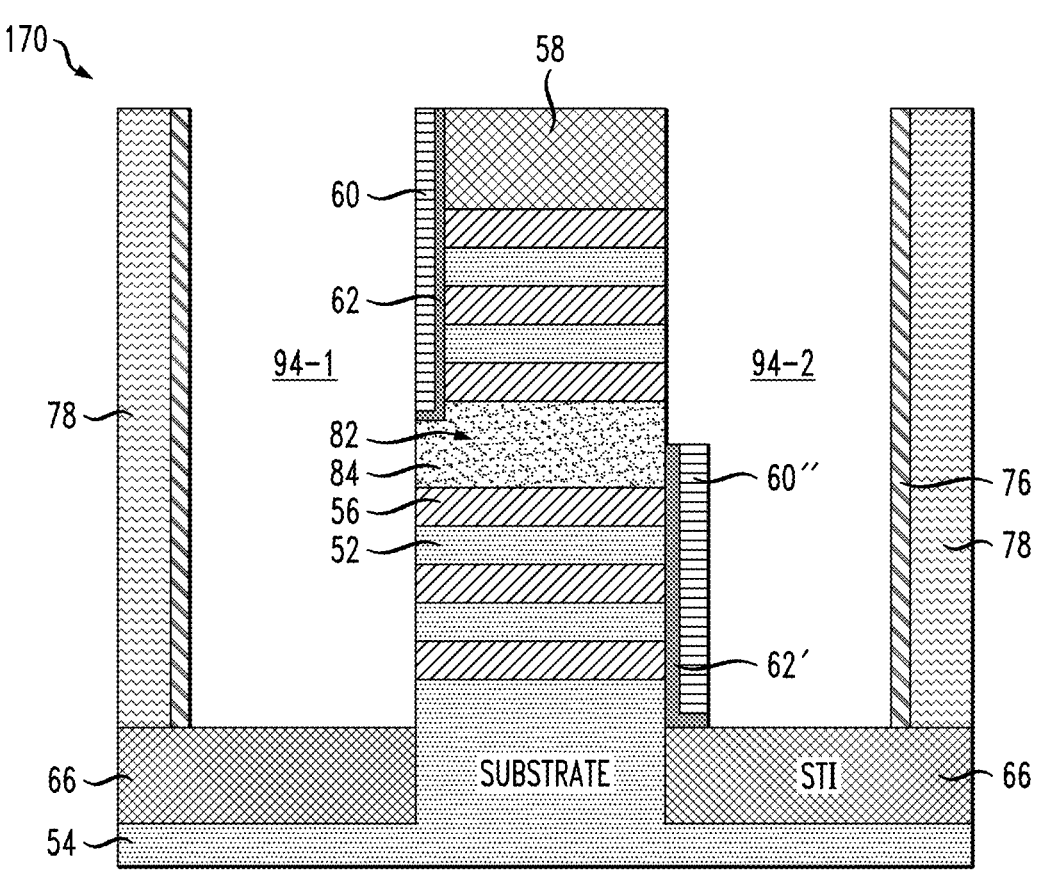
FIG. 17 is a schematic, cross-sectional view of the structure shown in FIG. 16A following removal of the sacrificial layer to form open pockets within the structure.

Referring to FIGS. 16A and 16B, the layers above the fin cap 58 are removed and the structure is planarized. As shown in FIG. 16A, the sacrificial gate 72 of the resulting structure 160 is exposed at this stage of the process. The sacrificial gate is then selectively removed by any suitable etching process, such as a reactive ion etch, to obtain a structure 170 as schematically illustrated in the x cross section in FIG. 17. The structure includes two RMG pockets 94-1, 94-2, one adjoining the bottom stack of semiconductor nanosheet layers and isolated from the top stack of such layers. The other RMG pocket 94-2 adjoins the top stack of semiconductor nanosheet layers and is separated from the bottom nanosheet stack by the bottom sidewall spacer 60". The exposed portions of the second oxide layer 62' at the trench (pocket) bottoms are selectively removed using, for example, a dry etch and a wet clean. Oxide removal is conducted using, for example, a self-limiting etch such as a SiCoNi™ vapor phase etch process (trademark of Applied Materials, Inc. Santa Clara, CA, USA). A SiCoNi™ etch is a plasma-assisted dry etch process that involves simultaneous exposure of a substrate to hydrogen, $NF_3$ and $NH_3$ plasma by-products.

Figure 18B:
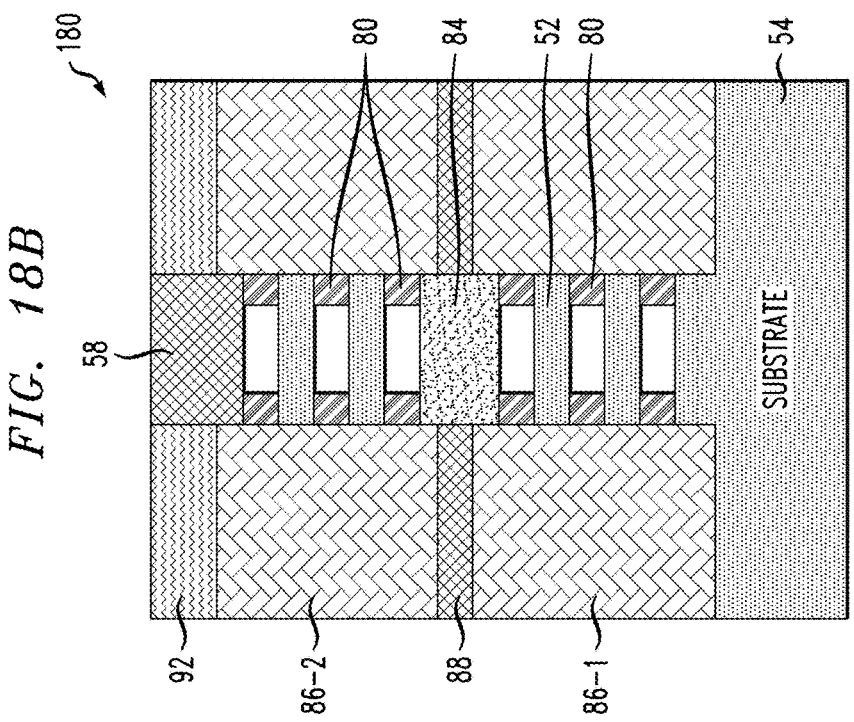
FIG. 18B is a schematic, cross-sectional view of the structure shown in FIG. 18A, taken along the y cross section.
Figure 18A:
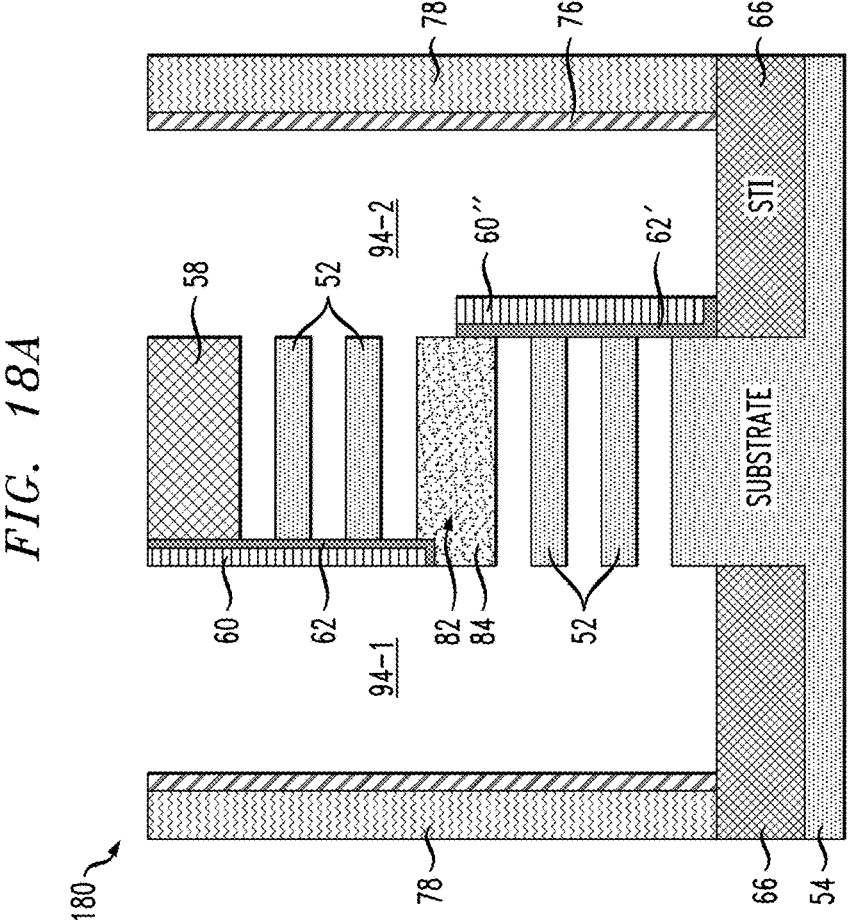
FIG. 18A is a schematic, cross-sectional view of the structure shown in FIG. 17 following removal of sacrificial nanosheet layers.

The silicon germanium layers 56 are selectively removed, leaving top and bottom stacks of silicon (channel) layers 52. Hydrogen chloride gas is employed in some embodiments to selectively remove silicon germanium, leaving silicon nanosheets substantially intact. Alternatively, a wet etch process containing ammonia and hydroperoxide can be used to etch SiGe selective to other materials. As shown in FIG. 18A and FIG. 18B, spaces are formed between the silicon (channel) nanosheet layers 52 of the resulting structure 180. The spaces within the bottom stack of nanosheet channel layers 52 are in communication with a first pocket 94-1 while the spaces within the top stack of nanosheet channel layers 52 are in communication with a second pocket 94-2. The top and bottom spacers 60, 60" respectively isolate the pockets 94-1, 94-2 from the spaces within the top and bottom stacks of nanosheet channel layers 52.

Figure 19B:
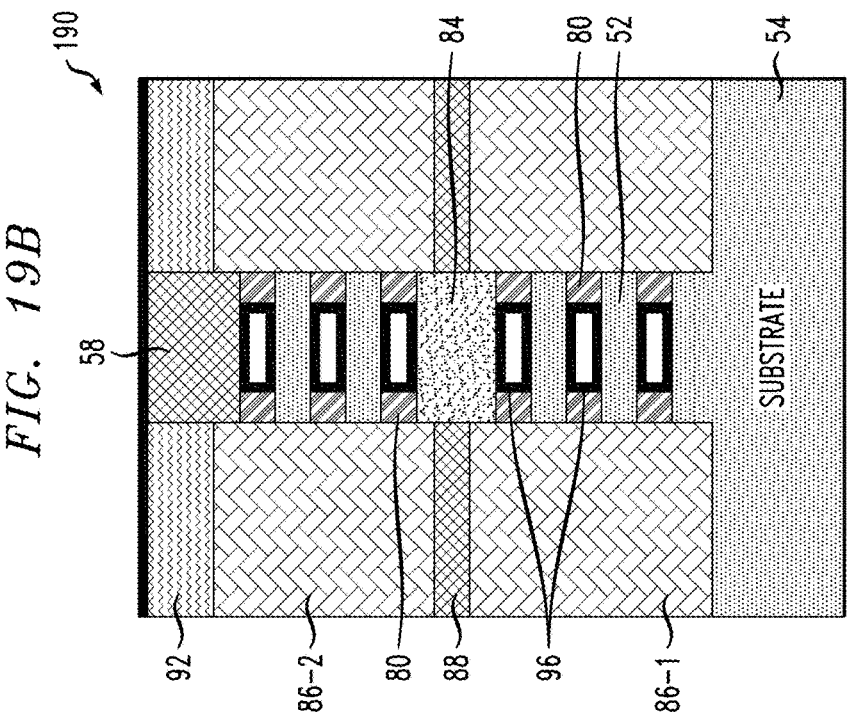
FIG. 19B is a schematic, cross-sectional view of the structure shown in FIG. 19A, taken along the y cross section.
Figure 19A:
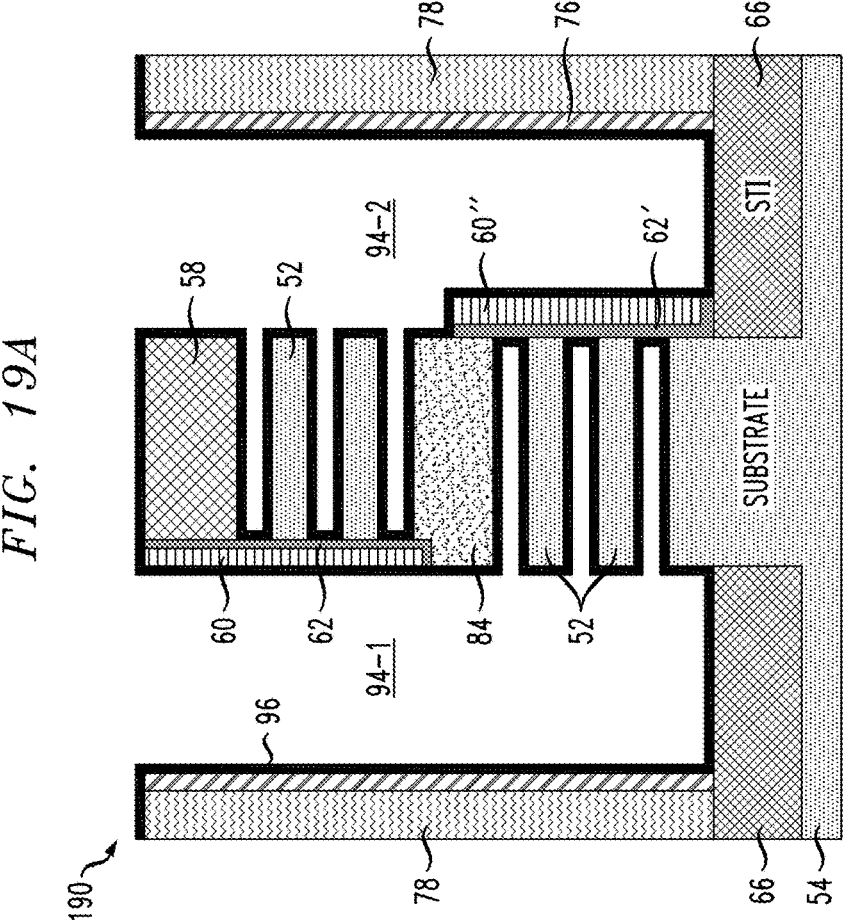
FIG. 19A is a schematic, cross-sectional view of the structure shown in FIG. 18A following deposition of a gate dielectric layer.

Gate stacks are formed in adjoining relation to the nanosheet (channel) layers 52. A gate dielectric layer 96 forms portions of the gate stacks that replace the sacrificial silicon germanium layers. The gate stacks adjoin the silicon nanosheet channel layers 52. Non-limiting examples of suitable materials for the gate dielectric layer 96 include oxides, nitrides, oxynitrides, silicates (e.g., metal silicates), aluminates, titanates, nitrides, or any combination thereof. Examples of high-k gate dielectric materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric layer 96 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In one exemplary embodiment, a high-k dielectric layer having a thickness of 2.5 nm is employed. In some embodiments, the gate dielectric layer 96 includes multiple layers. FIG. 19A and FIG. 19B illustrate an exemplary structure 190 following deposition of the gate dielectric layer.

Electrically conductive gate material is deposited in the spaces formerly filled by the silicon germanium layers. The deposited metal gate material forms the metal gate of the nanosheet field-effect transistors. In some embodiments, the electrically conductive gate includes a work function metal (WFM) layer. WFM serves dual purposes: Vt setting and gate conductor. Non-limiting examples of suitable work function metals include p-type work function metal materials and n-type work function metal materials. P-type work function materials include compositions such as ruthenium, palladium, platinum, cobalt, nickel, and conductive metal oxides, titanium nitride, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, a conformal ALD process.

Figure 20B:
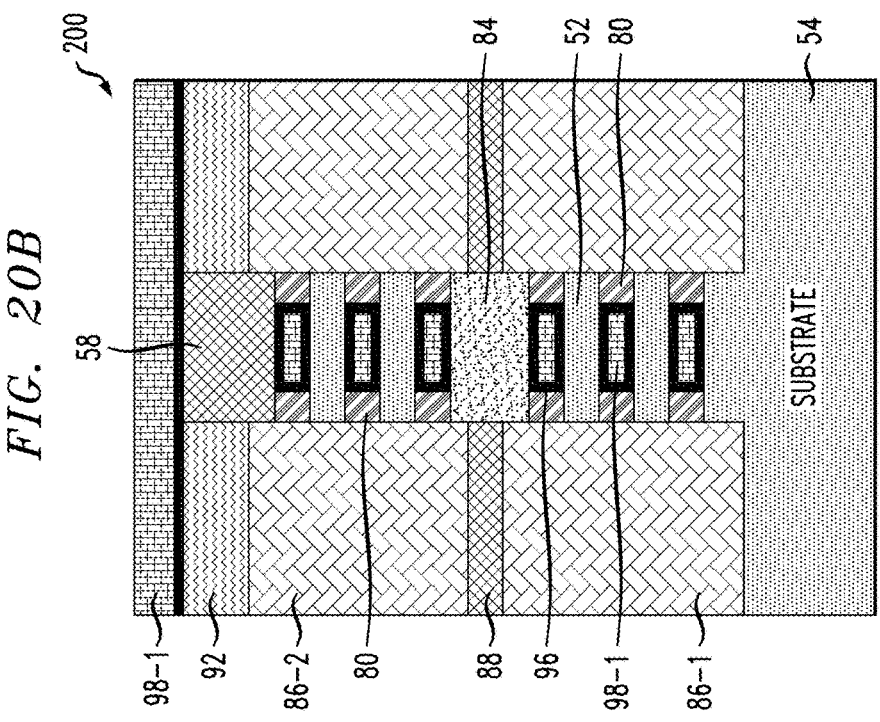
FIG. 20B is a schematic, cross-sectional view of the structure shown in FIG. 20A, taken along the y cross section.
Figure 20A:
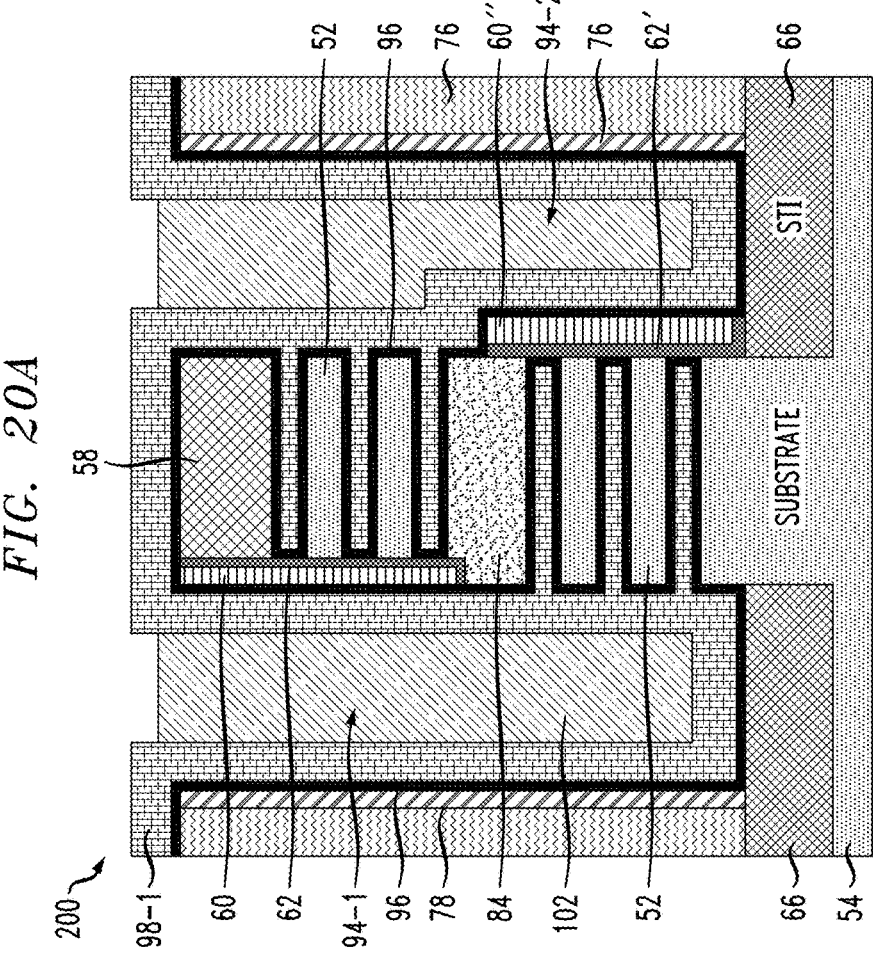
FIG. 20A is a schematic, cross-sectional view of the structure shown in FIG. 19A following deposition of a first workfunction metal layer and an organic planarization layer.

In one exemplary embodiment, an n-type WFM layer 98-1 having a thickness of three nanometers (3 nm) may be formed on the gate dielectric layer 96. The thickness of the WFM layer may, for example, be in the range of two to ten nanometers (2-10 nm), with thinner layers being used as device scaling decreases. The stacked, nanosheet FET structure to be formed in one or more embodiments will include both n-type and p-type transistor structures. The n-type WFM layer 98-1 is intended for use in association with the n-type transistor. A portion of the n-type WFM layer will accordingly be replaced later in the process. The n-type WFM layer 98-1 and the gate dielectric may fill the spaces between the silicon channel layers 52, but does not entirely fill the pockets 94-1, 94-2 adjoining the channel layers. An OPL fill 102 is deposited in the spaces remaining in the pockets 94-1, 94-2 following deposition of the n-type WFM layer. The OPL fill is recessed below the portion of the n-type WFM layer that extends across the top surface of the structure 200, as best shown in FIG. 20A.

Figure 21B:
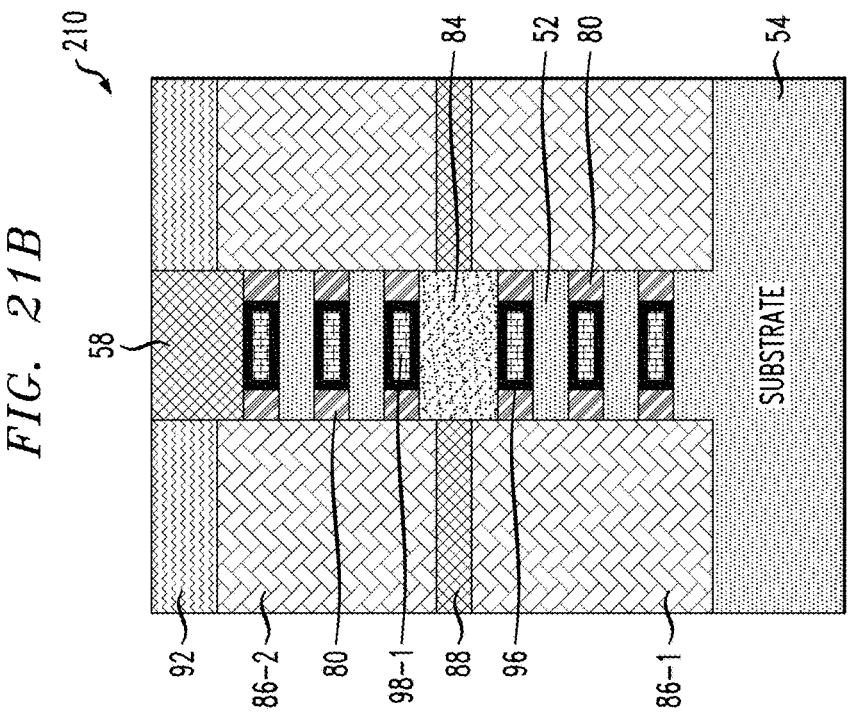
FIG. 21B is a schematic, cross-sectional view of the structure shown in FIG. 21A, taken along the y cross section.
Figure 21A:
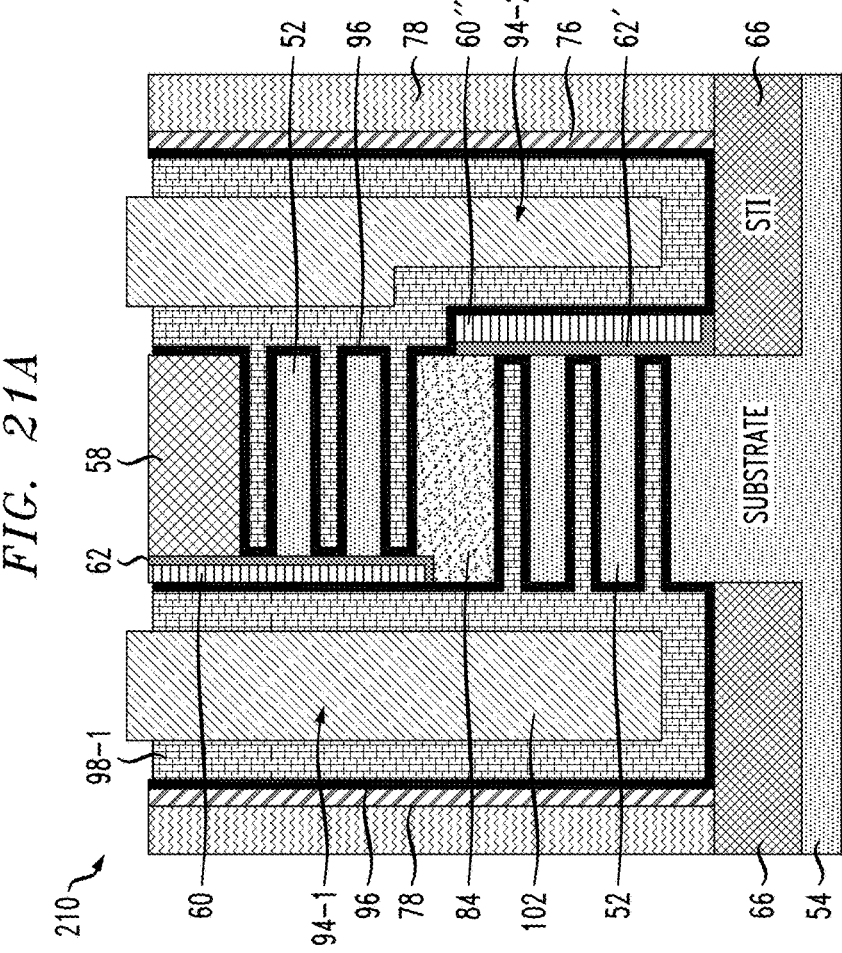
FIG. 21A is a schematic, cross-sectional view of the structure shown in FIG. 20A following removal of exposed portions of the first workfunction metal layer and the gate dielectric layer.

The exposed portion of the gate stack (comprising the n-type WFM layer 98-1 and the gate dielectric layer 96) are removed, thereby obtaining a structure 210 as schematically illustrated in FIG. 21A and FIG. 21B. The n-type WFM layer 98-1 over the cap 58 and top dielectric layer 92 may be removed using, for example, a timed SC1 etch. Some undercutting of the metal beneath the top surface of the cap 58 may occur. Removal of gate dielectric material from the top of the structure may be accomplished using the same etch or other suitable etch process. It will be appreciated that other etch processes may alternatively be employed to remove the portions of the metal and gate dielectric layers that extend over the structure 200.

Figure 22B:
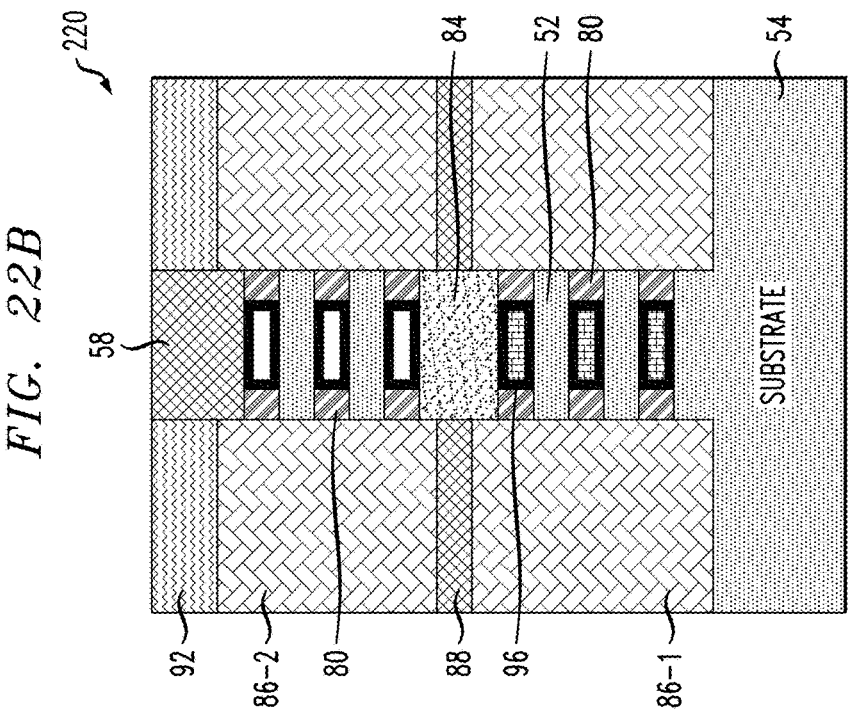
FIG. 22B is a schematic, cross-sectional view of the structure shown in FIG. 22A, taken along the y cross section.
Figure 22A:
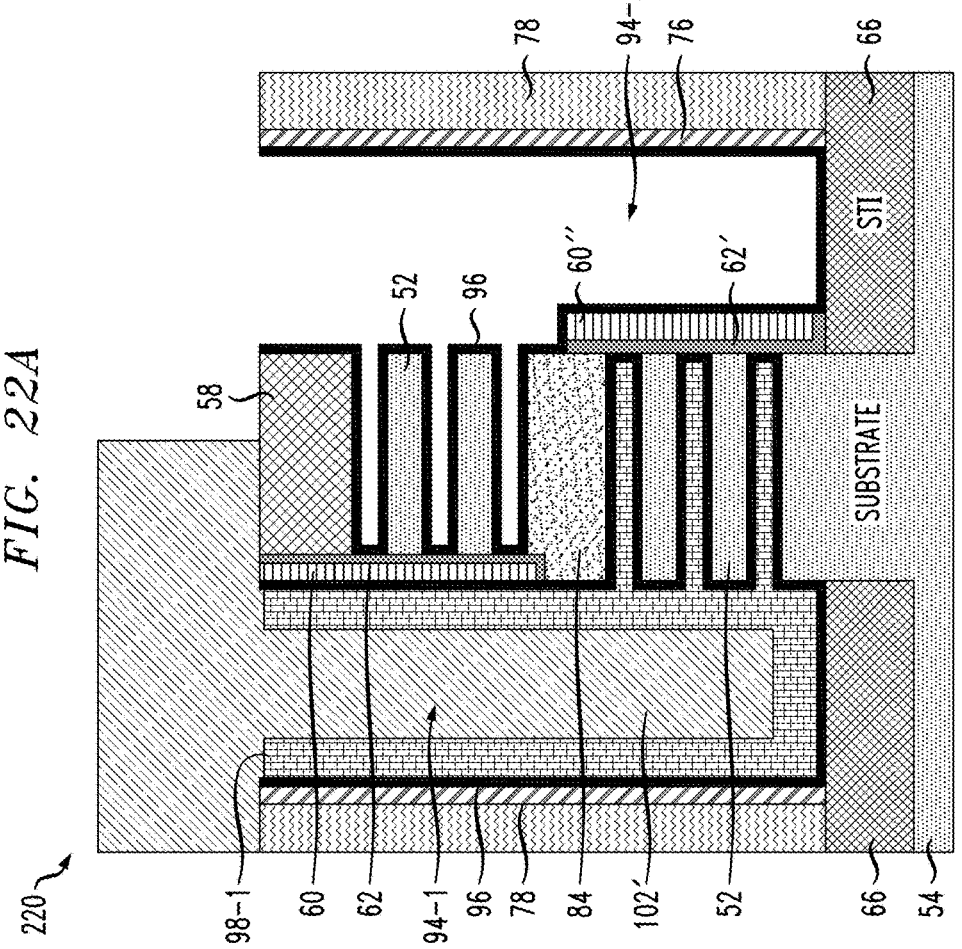
FIG. 22A is a schematic, cross-sectional view of the structure shown in FIG. 21A following removal of the first workfunction metal layer from a portion of the structure.

A further organic planarization layer (OPL) 102' is formed on the resulting structure and patterned. Depending on the lithography technique employed for patterning, the OPL 102' may further include a hard mask on the OPL, such as a low-temperature oxide (LTO) or a silicon-containing anti-reflective coating (SiARC) (not shown). As shown in FIG. 22A and FIG. 22B, the n-type WFM layer 98-1 in the nFET region of the stacked FET architecture is protected by the patterned OPL. The exposed portion of the n-type WFM layer 98-1 in the pFET region is removed, leaving an open pocket 94-2 on one side of the structure 220 and open spaces between the silicon channel layers 52 above the dielectric fill (spacer) layer 84. Gate metal is accordingly removed from the pFET region while the protected nFET region remains intact. An SC1 etch or other suitable etch processes can be employed to selectively remove gate metal while leaving the gate dielectric layer 96 substantially intact. The patterned OPL 102', which covers the nFET region, protects the bottom (nFET) gate metal layer. The duration of the etch, which is sufficient to allow removal of all gate metal from the pFET region, does not affect the gate metal in the nFET region. FIG. 22A and FIG. 22B schematically illustrate the resulting monolithic structure 220. The OPL 102' is subsequently removed.

Figure 23B:
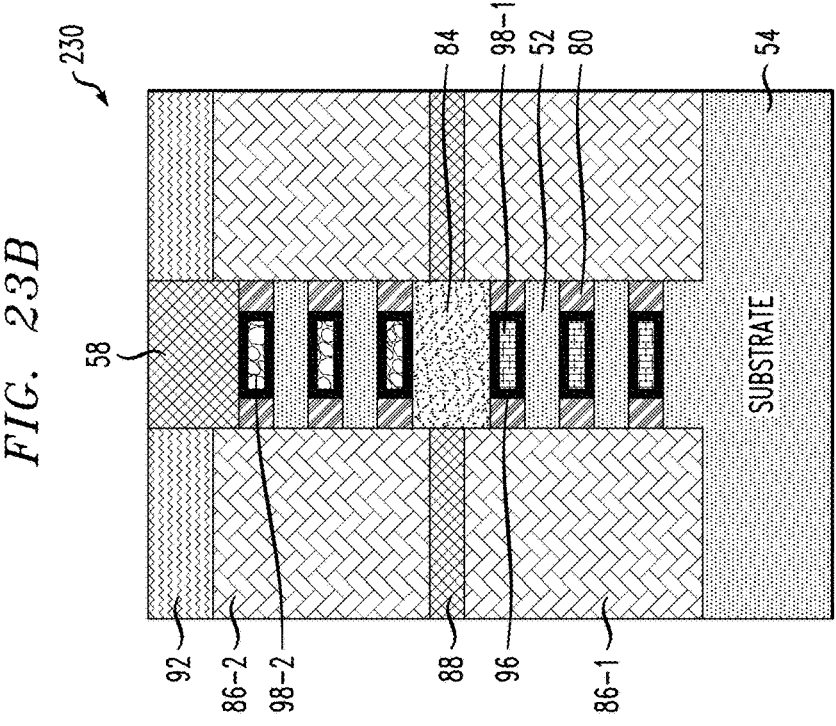
FIG. 23B is a schematic, cross-sectional view of the structure shown in FIG. 23A, taken along the y cross section.
Figure 23A:
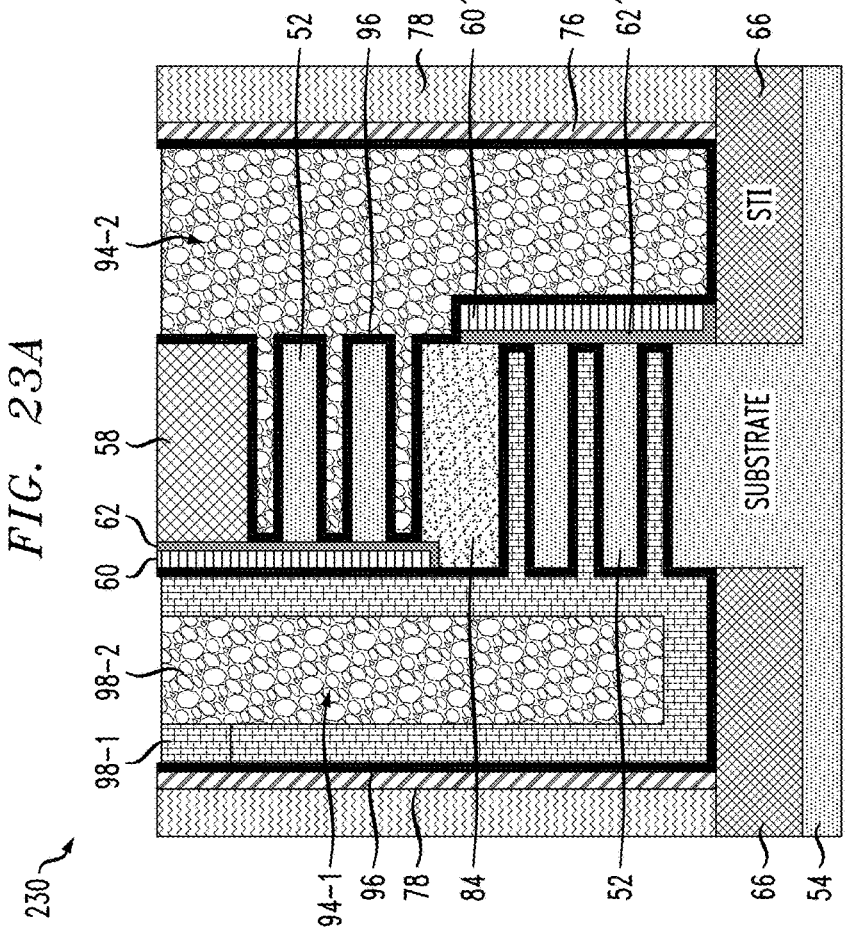
FIG. 23A is a schematic, cross-sectional view of the structure shown in FIG. 22A following deposition and planarization of a second workfunction metal layer.

Following removal of the originally deposited n-type WFM layer 98-1 from the pFET region, new gate metal deemed appropriate for the pFET transistors is deposited. A p-type WFM layer 98-2 is deposited in embodiments wherein the first-deposited metal is n-type. It will be appreciated that the process can be reversed, and n-type metal can be deposited subsequent to p-type metal in some alternative embodiments. The p-type WFM layer 98-2 fills the portion of the space 94-1 within the n-type WFM layer 98-1 on one side of the structure 230, as shown in FIG. 23A and FIG. 23B. It further fills the spaces between the silicon channel layers 52 above the dielectric spacer layer 84 and the space 94-2 on the opposite side of the structure 230, as shown in FIG. 23A. Metal overburden can be removed using chemical mechanical planarization to obtain the exemplary structure 230.

Figure 24B:
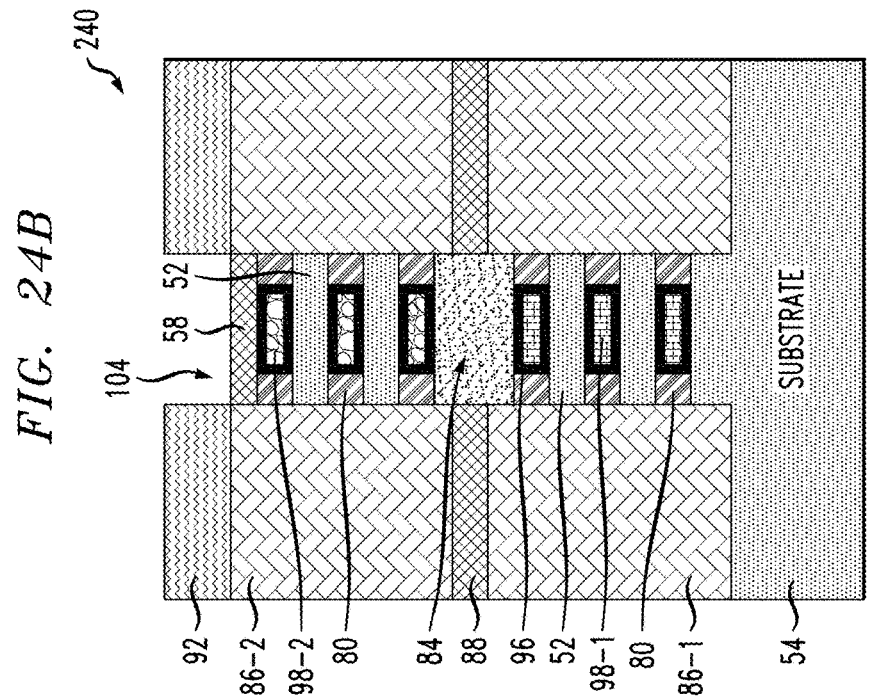
FIG. 24B is a schematic, cross-sectional view of the structure shown in FIG. 24A, taken along the y cross section.
Figure 24A:
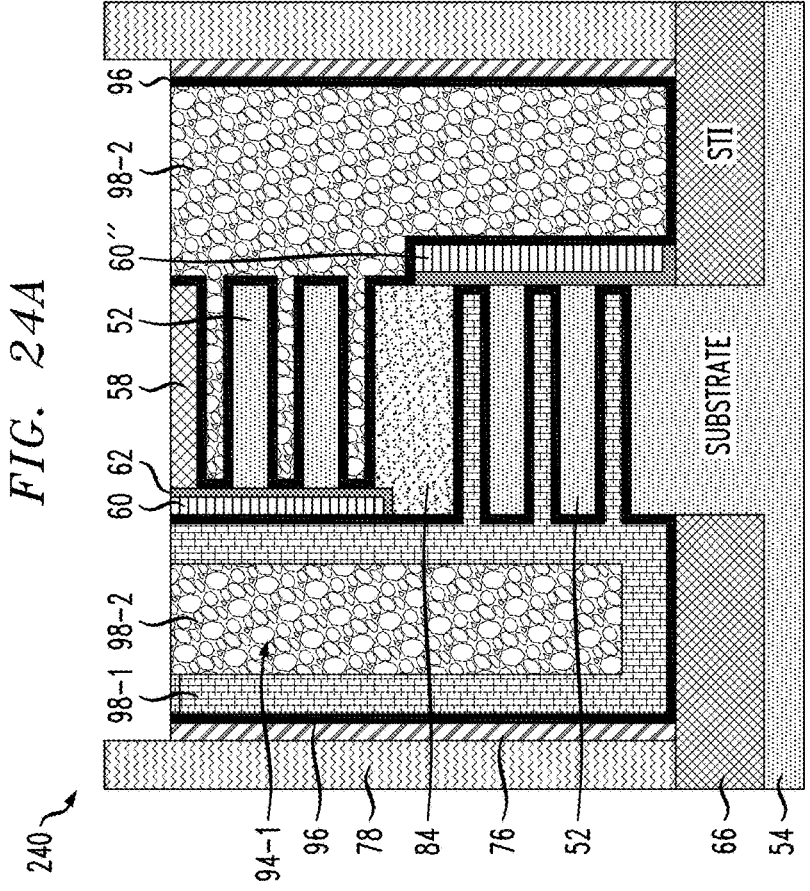
FIG. 24A is a schematic, cross-sectional view of the structure shown in FIG. 23A following recessing of the second workfunction metal layer and hard mask layer, in accordance with a first optional process to strap gate regions.

The stacked FET architecture obtained using the techniques described above facilitates metal strapping of n-p gate electrodes or optionally providing unconnected gate electrodes. As discussed above, logic cells may be designed with connected n-p gate electrodes while other types of devices may require unconnected gate electrodes. In embodiments wherein metal strapping is desired, the WFM layers 98-1, 98-2 and the dielectric cap 58 on the stack of silicon channel and WFM layers are recessed simultaneously or sequentially. A silicon nitride cap can be etched selectively using, for example, hot phosphoric acid. Such recessing leaves a trench 104 at the top of the resulting structure 240, such as shown in FIG. 24A and FIG. 24B. Top surfaces of the WFM layers 98-1, 98-2 of the nFET and pFET devices are exposed at the bottom of the trench 104.

Figure 25B:
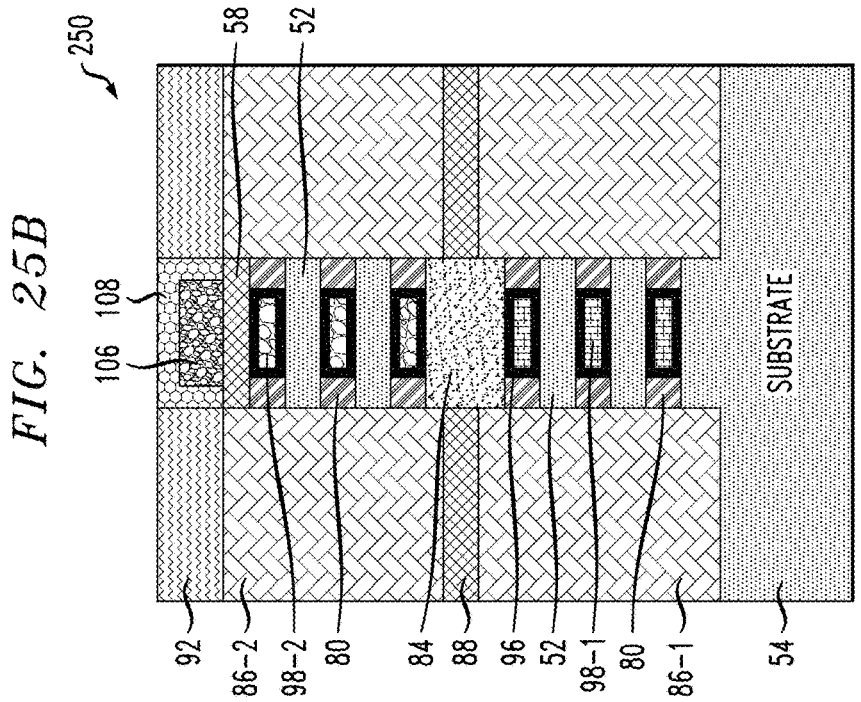
FIG. 25B is a schematic, cross-sectional view of the structure shown in FIG. 25A, taken along the y cross section.
Figure 25A:
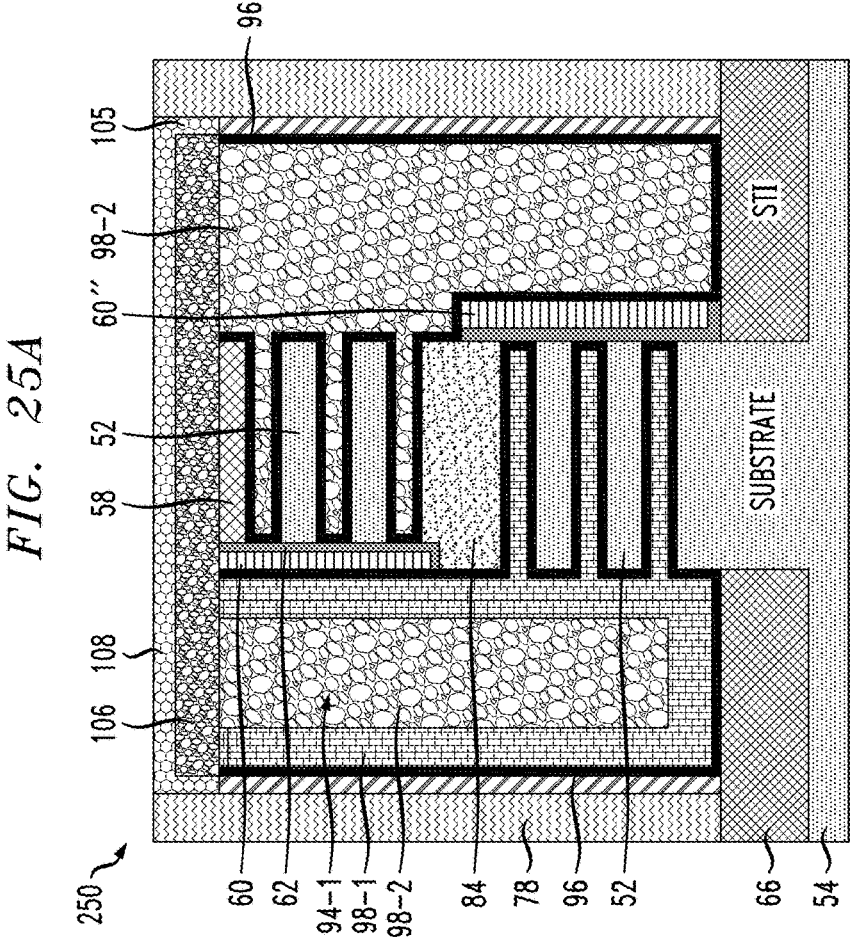
FIG. 25A is a schematic, cross-sectional view of the structure shown in FIG. 24A following formation of sidewall spacers, deposition of a metal fill layer, etch-back of the metal fill layer, and deposition of a cap over the metal fill layer.

Dielectric sidewall spacers 105 are formed on the sidewalls of the trench 104. Silicon nitride spacers are formed in some embodiments. A metal layer is deposited within the trench 104 and etched back, thereby forming a metal strap 106 extending between the sidewall spacers 105. The metal strap may comprise, for example, cobalt, titanium nitride, tungsten (W), or a combination of these metals deposited by CVD or atomic layer deposition (ALD). The metal strap 106 electrically connects the metal gates of the stacked nanosheet transistors. As shown in FIG. it directly contacts both WFM layers 98-1, 98-2 on one side of the exemplary structure 250 and one of the WFM layers 98-2 on the opposite side of the exemplary structure. The gate of the n-type nanosheet field-effect transistor, which comprises the lower silicon nanosheet channel layers 52 in the exemplary embodiment, is electrically connected to the p-type nanosheet field-effect transistor. A dielectric cap layer 108 is formed on the metal strap 106 and planarized to obtain a structure 250 as schematically illustrated in FIG. 25A and FIG. 25B.

In summary, the structure 250 includes stacked, nanosheet n-type and p-type transistors, the gates of which are electrically connected by the metal strap 106. The n-type transistor comprises nanosheet channel layers 52 beneath the dielectric fill layer 84 that forms a dielectric spacer between two sets of nanosheet channel layers. The nanosheet channel layers 52 above the dielectric fill (spacer) layer 84 form an element of the p-type transistor of the stacked architecture. The nanosheet channel layers of the n-type transistor are adjoined by a gate stack comprising the gate dielectric layer 96 and the n-type WFM layer 98-1. The vertically extending, bottom sidewall spacer 60" and underlying oxide layer 62' seal the bottom nanosheet channel layers 52 and spaces therebetween from the pocket 94-2 containing the p-type WFM layer 98-2 forming the gate electrode of the p-type transistor. The vertically extending, top sidewall spacer 60 and underlying oxide layer 62 seal the top nanosheet channels from the pocket 94-1 containing the n-type WFM layer 98-1. Source/drain regions 86-1 having n-type conductivity adjoin opposing ends of the bottom nanosheet channel layers 52. Source/drain regions having p-type conductivity adjoin opposing ends of the top nanosheet channel layers 52. The metal strap 106 directly contacts portions of two WFM layers 98-1, 98-2 within one pocket 94-1 of the structure 250 to form an electrical connection with the gate electrode of the n-type transistor. The metal strap 106 is electrically connected to only one of the WFM layers in forming an electrical connection with the gate electrode of the p-type transistor.

Figure 26B:
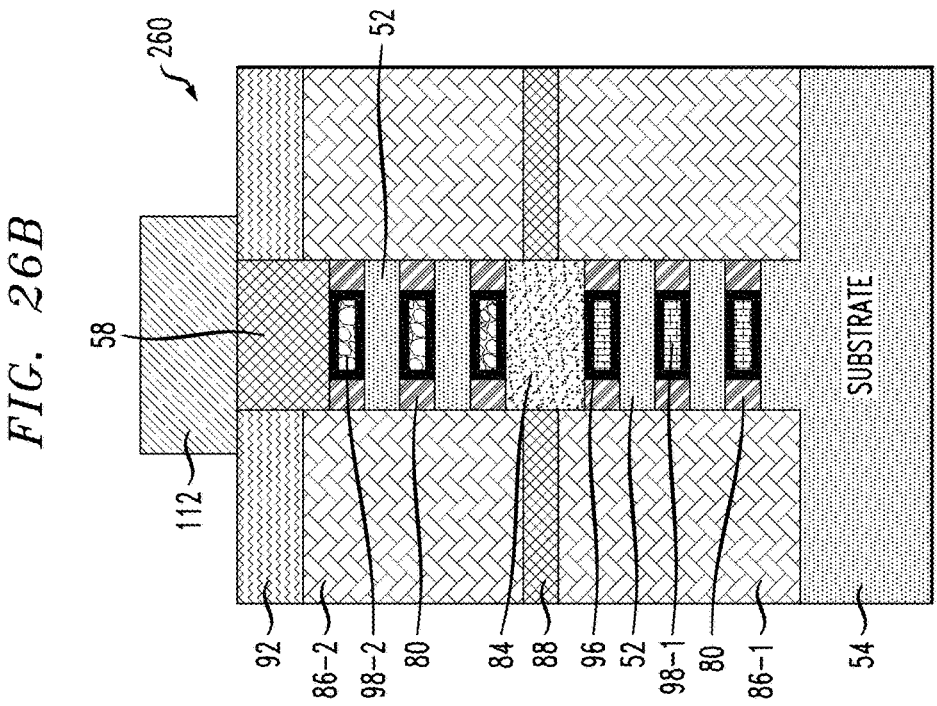
FIG. 26B is a schematic, cross-sectional view of the structure shown in FIG. 26A, taken along the y cross section.
Figure 26A:
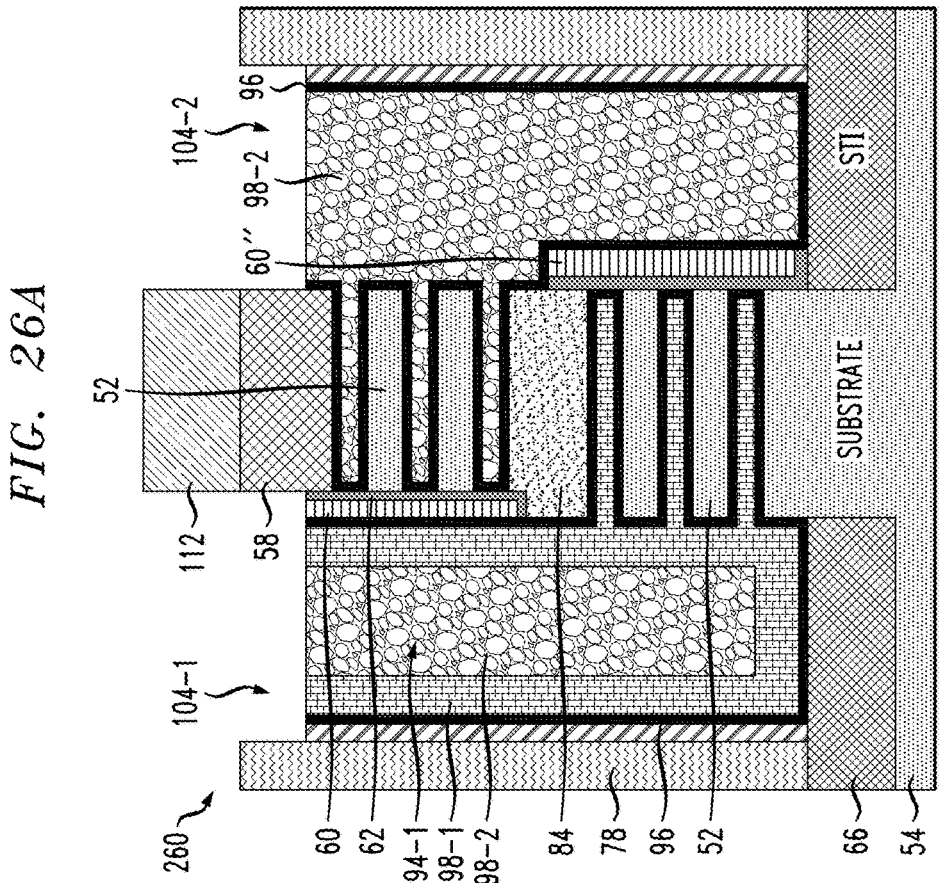
FIG. 26A is a schematic, cross-sectional view of the structure shown in FIG. 24A following formation of a block mask in accordance with a second optional process wherein unstrapped gate regions are formed.

The structure 230 obtained using the techniques described above can easily be adapted for non-strapping embodiments where electrical connection of the gate electrodes is not required. Devices having connected and unconnected n-p gate electrodes can be formed on the same wafer or chip in some embodiments. Referring to FIG. 26A and FIG. 26B, an organic planarization layer 112 is deposited and patterned to protect the dielectric cap 58 over the stack of channel layers. Trenches 104-1 and 104-2 are then formed in the structure. The trenches 104-1 and 104-2 are isolated by the dielectric cap, which remains substantially intact while the WFM layers and other layers are recessed to form the trenches. A structure 260 as illustrated in FIG. 26A and FIG. 26B may be obtained.

Figure 27B:
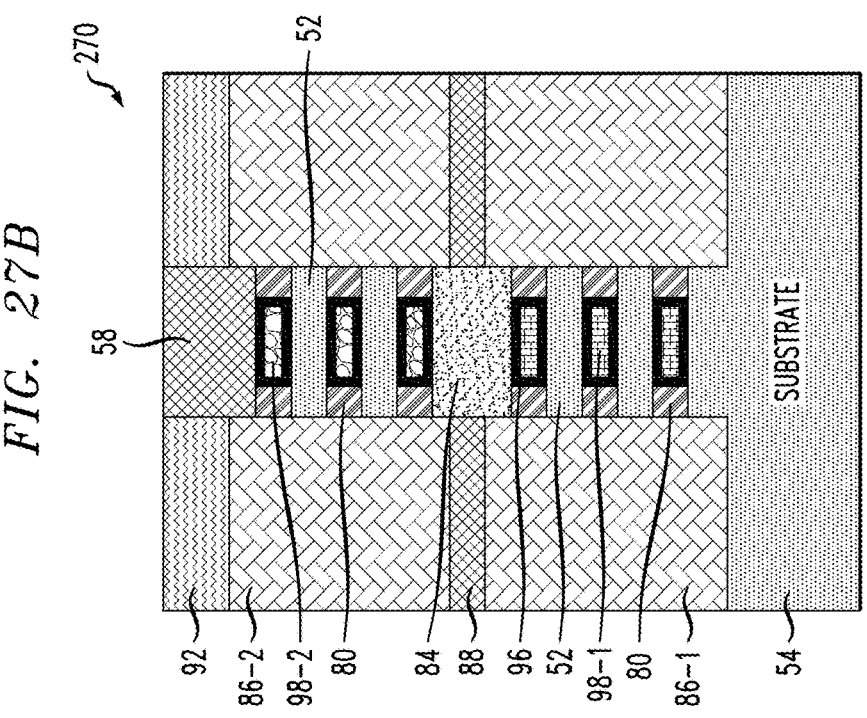
FIG. 27B is a schematic, cross-sectional view of the structure shown in FIG. 27A, taken along the y cross section.
Figure 27A:
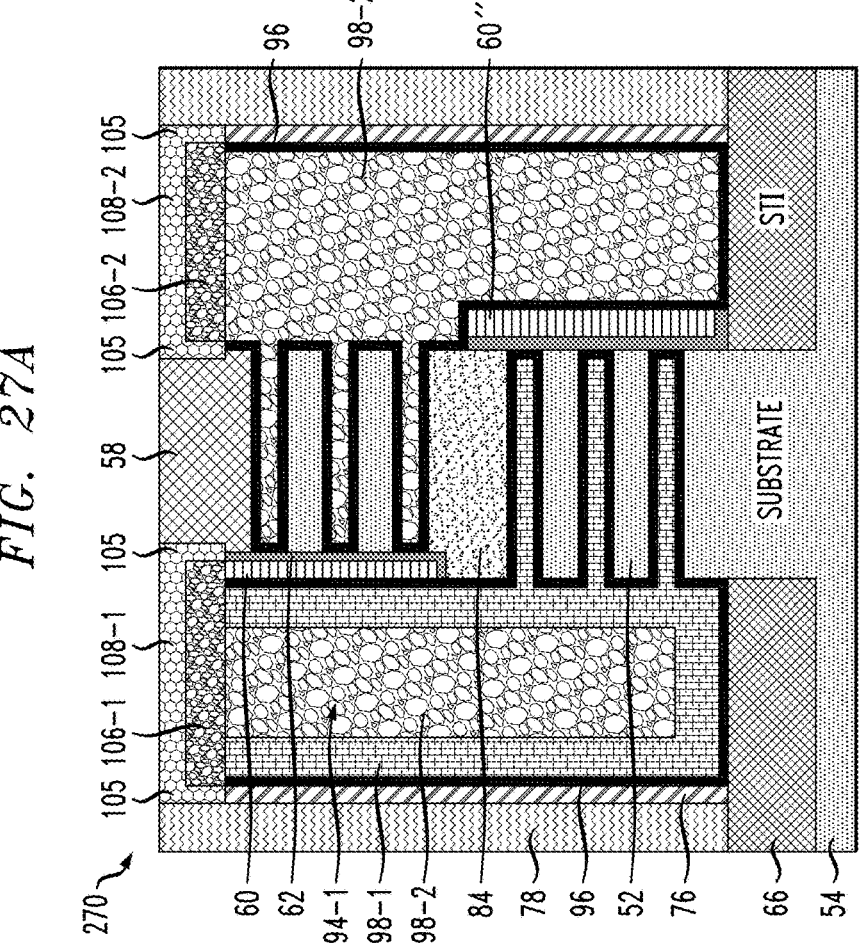
FIG. 27A is a schematic, cross-sectional view of the structure shown in FIG. 26A following formation of sidewall spacers, deposition of a metal fill layer, etch-back of the metal fill layer, and deposition of a cap over the metal fill layer.

The organic planarization layer 112 is removed from the structure and dielectric sidewall spacers 105 are formed on the sidewalls of the trenches 104-1, 104-2. A metal layer is deposited on the structure and recessed, forming metal gate contacts 106-1 and 106-2 within the trenches 104-1, 104-2. The metal gate contacts are electrically isolated by the dielectric cap 58. Dielectric cap layers 106-1, 106-2 are formed over the metal gate contacts and planarized to obtain a structure 270 as schematically illustrated in FIG. 27A and FIG. 27B. Each metal gate contact is electrically connected to the gate electrode of only one of the nanosheet transistors in the stacked transistor architecture. In the exemplary embodiment, the gate contact 106-1 is electrically connected only to the gate electrode of the n-type nanosheet transistor.

Figure 28:
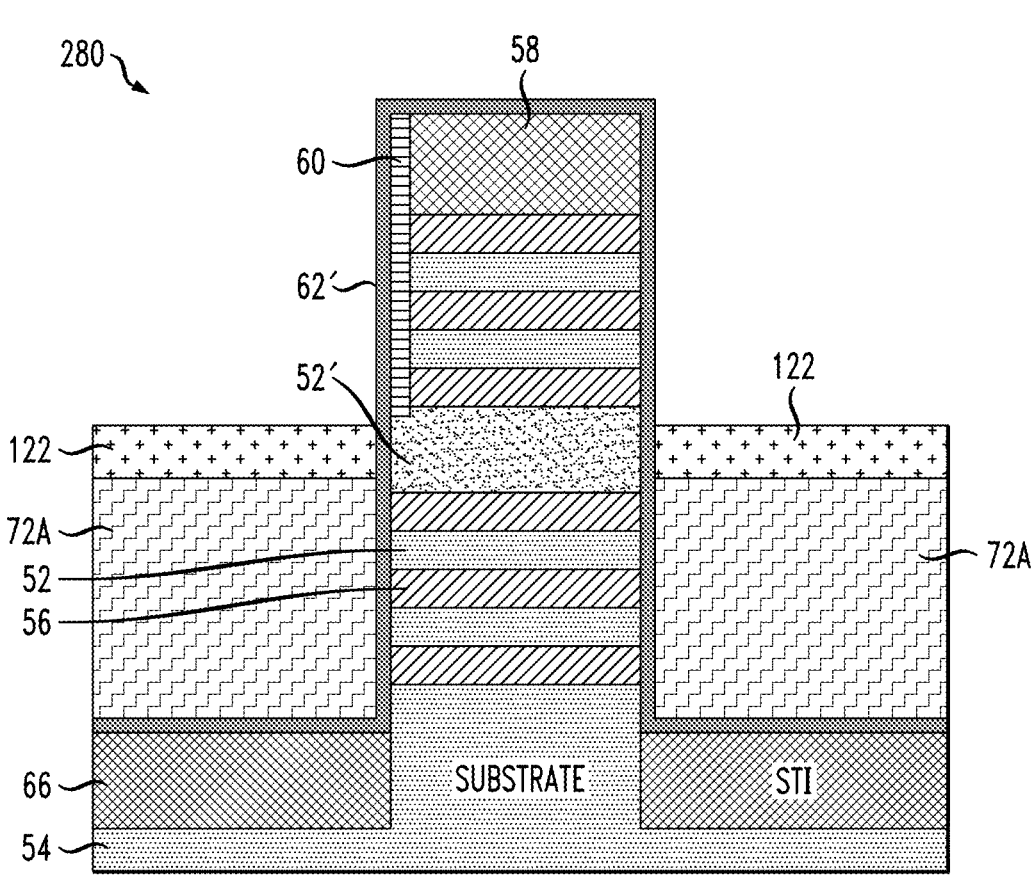
FIG. 28 is a schematic, cross-sectional view, taken along the x cross section, of a structure obtained during a stage of an alternative process of forming a stacked FET architecture.

A stacked FET architecture in accordance with a further embodiment of the invention also includes isolated RMG pockets for top and bottom FETs. FIG. 28 shows, in the x cross-sectional direction, a structure 280 obtained during the process of fabricating the further embodiment. Some elements of the structure 280 are the same or similar to those described above and the same reference numerals are used to designate such elements. A fin-like stack of nanosheet layers comprising silicon channel layers 52, silicon germanium layers 56, and a sacrificial silicon layer 52 can be obtained using techniques described above with respect to FIG. 2 through FIG. 5. The structure 280 further includes a top spacer 60 extending along one side of the upper portion of the fin-like stack. In the exemplary embodiment, there is no oxide liner between the top spacer 60 and the adjoining nanosheet layers. A conformal oxide liner 62' extends over the fin-like stack, the top spacer 60 and the STI regions 66. A bottom sacrificial gate layer 72A is formed over the STI regions. The bottom sacrificial gate layer may comprise, for example, amorphous silicon (a-Si) or polycrystalline silicon (polysilicon) and be deposited using techniques as described above with respect to the sacrificial gate layer 72 and recessed. A dielectric layer forming a gate separator 122 is deposited on the top surface of the bottom sacrificial gate layer 72A. The horizontally extending gate separator 122 may be comprised of dielectric materials such as silicon nitride. The top surface of the gate separator 122 is below the level of the top surface of the relatively thick silicon layer 52' while the bottom surface thereof is above the level of the bottom surface of the relatively thick silicon layer 52'.

Figure 29:
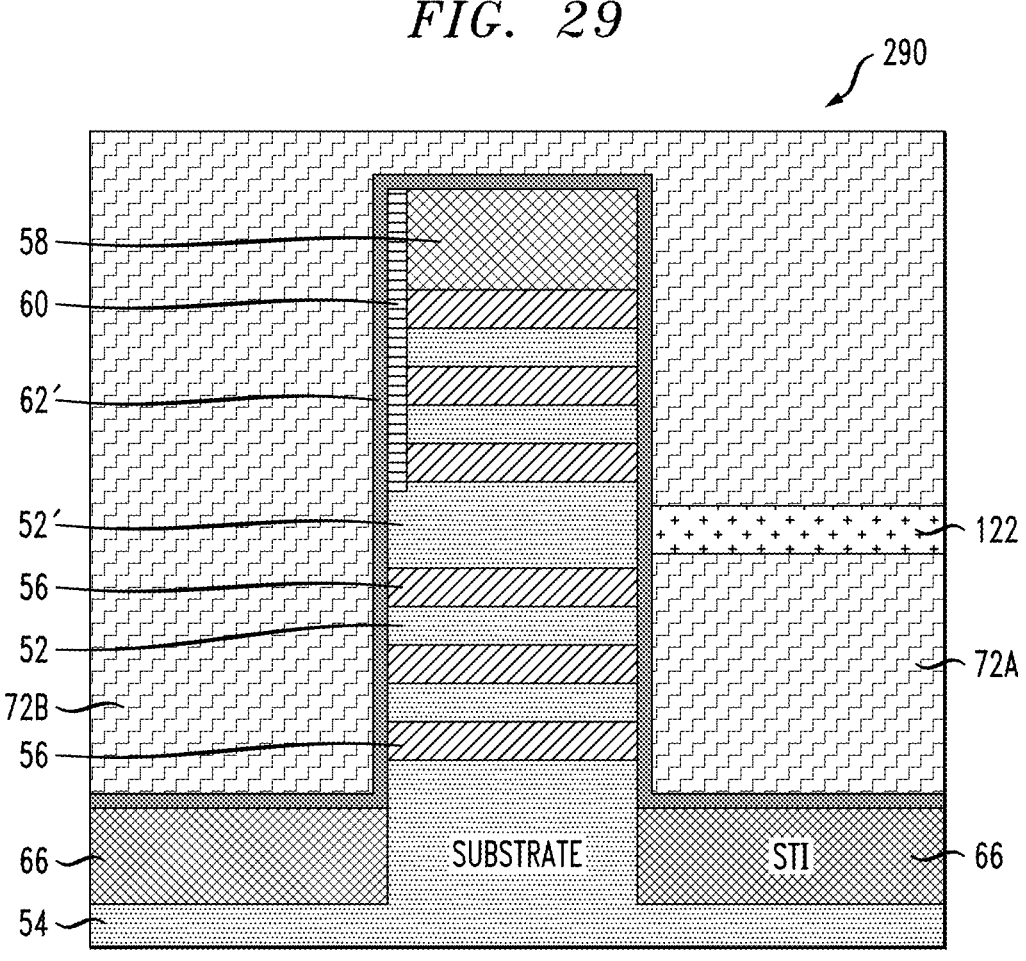
FIG. 29 is a schematic, cross-sectional view of the structure shown in FIG. 28 following removal of a portion of a horizontal isolation layer and deposition of sacrificial material.

The gate separator 122 extending over one side of the bottom sacrificial gate layer is selectively removed. The gate separator on the opposite side of the nanosheet stack is protected during the removal process and remains intact. A second sacrificial gate layer 72B is then deposited on the structure and extends over the nanosheet stack. The second sacrificial gate layer has a bottom surface that adjoins the oxide layer 62' on one side of the resulting structure 290. The second sacrificial gate layer adjoins the top surface of the gate separator 122 on the opposite side of the structure. FIG. 29 shows the exemplary structure 290 as viewed along the x cross section.

Figure 30B:
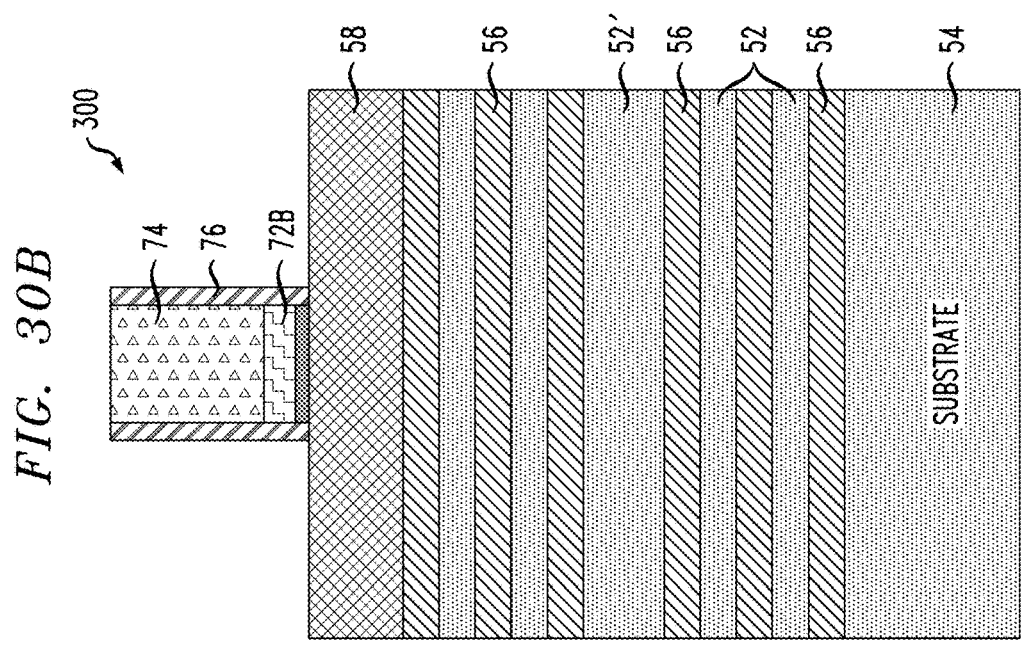
FIG. 30B is a schematic, cross-sectional view of the structure shown in FIG. 30A, taken along the y cross section.
Figure 30A:
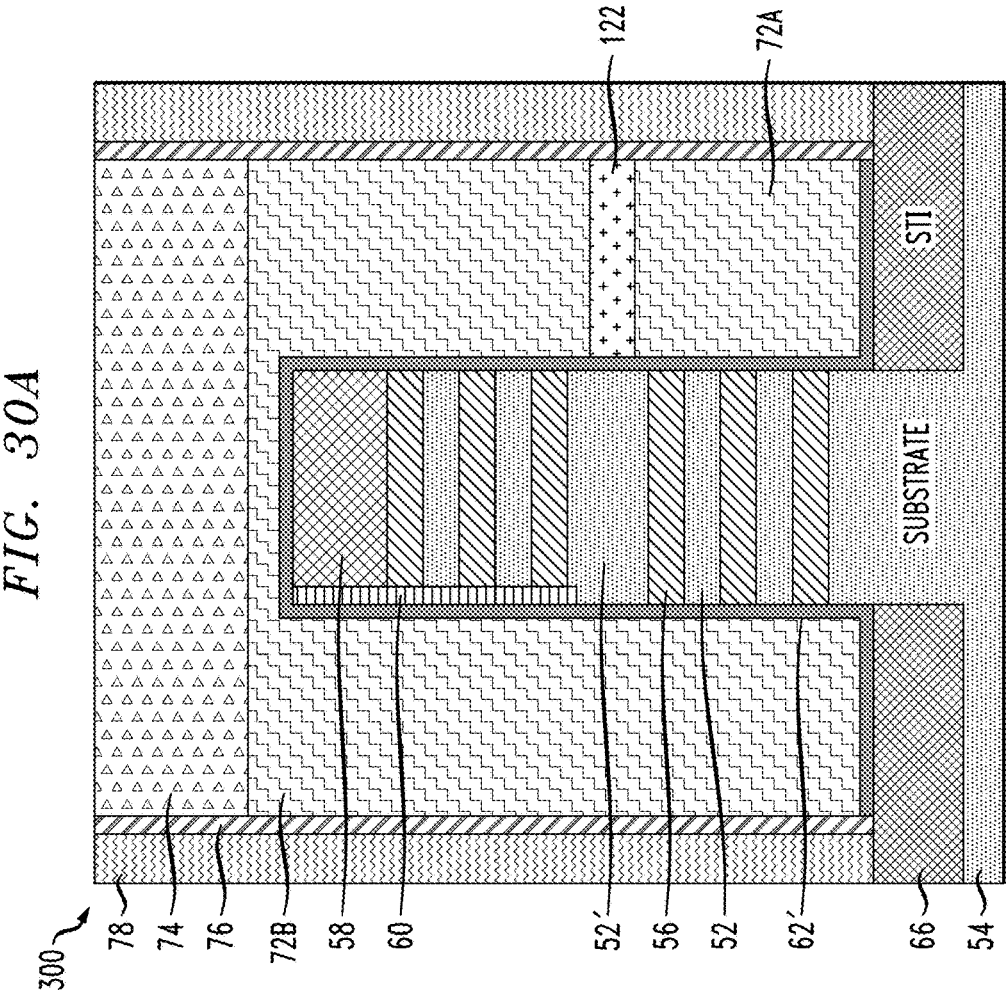
FIG. 30A is a schematic, cross-sectional view of the structure shown in FIG. 29 following deposition of a hard mask, directional etching of the sacrificial material, and other process steps.

A hard mask 74 is deposited and patterned on the top surface of the sacrificial gate layers 72A, 72B. The sacrificial gate layers are then subjected to a reactive ion etch down to the oxide layer 62' on the STI regions 66. Dielectric sidewall gate spacers 76 are then formed on the hard mask 74 and underlying layers, including the sacrificial gate layers. A dielectric fill 78 as shown in FIG. 30A is then deposited and planarized down to the top surface of the hard mask 74 to obtain the schematically illustrate structure 300 shown in FIG. 30A and FIG. 30B.

Figure 31B:
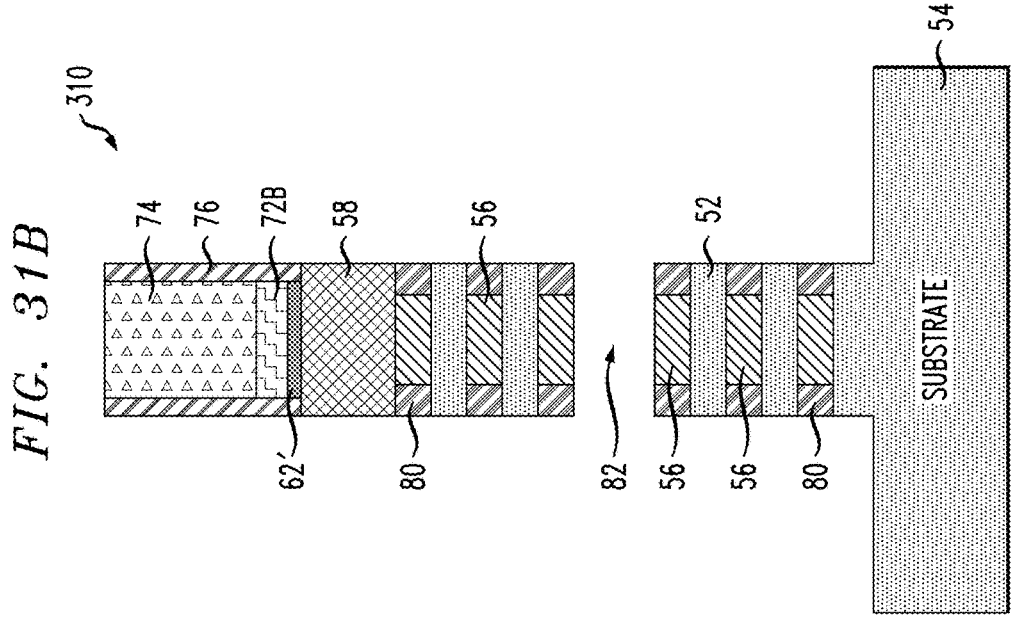
FIG. 31B is a schematic, cross-sectional view of the structure shown in FIG. 31A, taken along the y cross section.
Figure 31A:
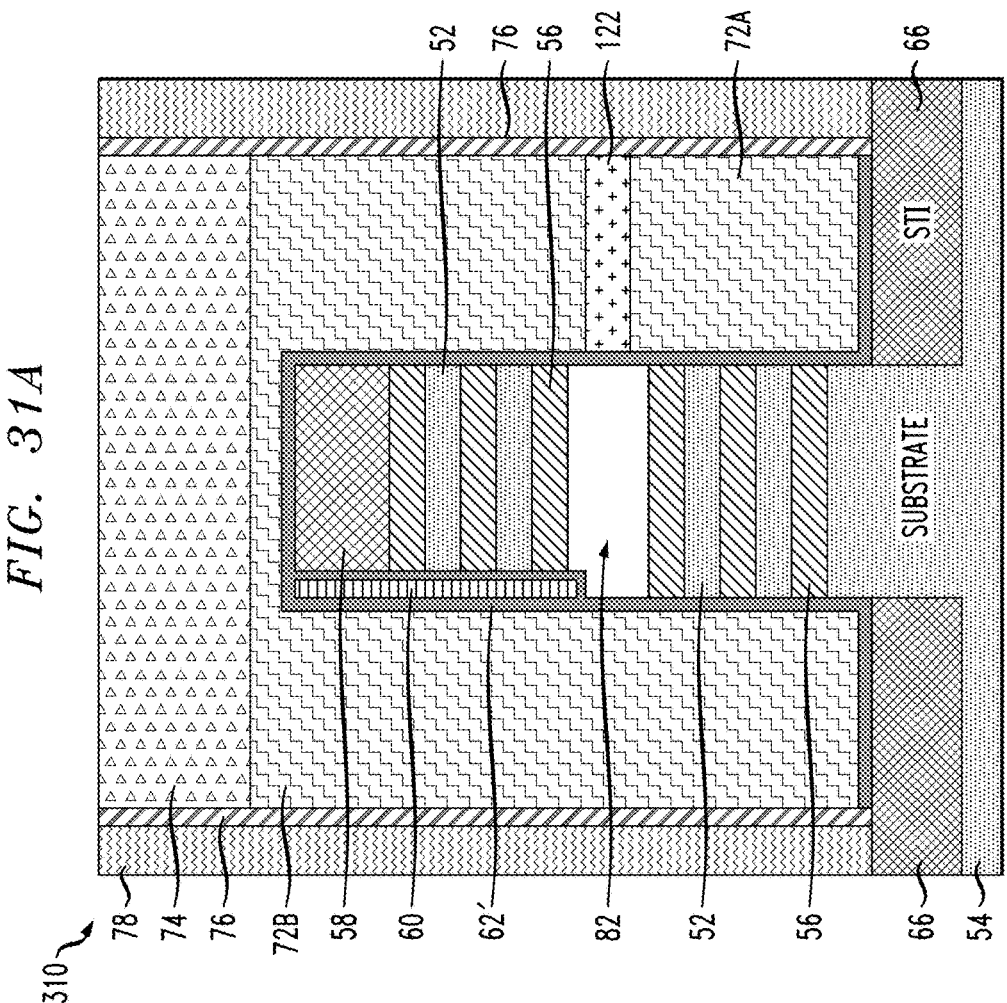
FIG. 31A is a schematic, cross-sectional view of the structure shown in FIG. 30A following a directional etch of the nanosheet stack and removal of a sacrificial layer within the nanosheet stack.

Referring to FIG. 31A and FIG. 31B, the stack of nanosheet semiconductor layers is subjected to a reactive ion etch down to the substrate 54. The resulting structure is subjected to a timed wet etching process to selectively recess the silicon germanium layers 56 within the stack of nanosheet semiconductor layers, as described above with respect to FIG. 11. Dielectric spacer material is deposited in the trenches resulting from the reactive ion etch of the stack of semiconductor layers. The dielectric spacer material is etched back to form inner spacers 80 within each of the indents between the silicon channel layers 52 in the stack of nanosheet semiconductor layers. A selective reactive ion etch may be employed to remove the dielectric inner spacer material outside of the indents between silicon layers. The relatively thick silicon layer 52' is removed to form a space 82 between sets of stacked semiconductor layers, as described above with respect to the structure shown in FIG. 12A and FIG. 12B. A structure 310 as illustrated in FIGS. 31A and 31B may accordingly be obtained.

Figure 32B:
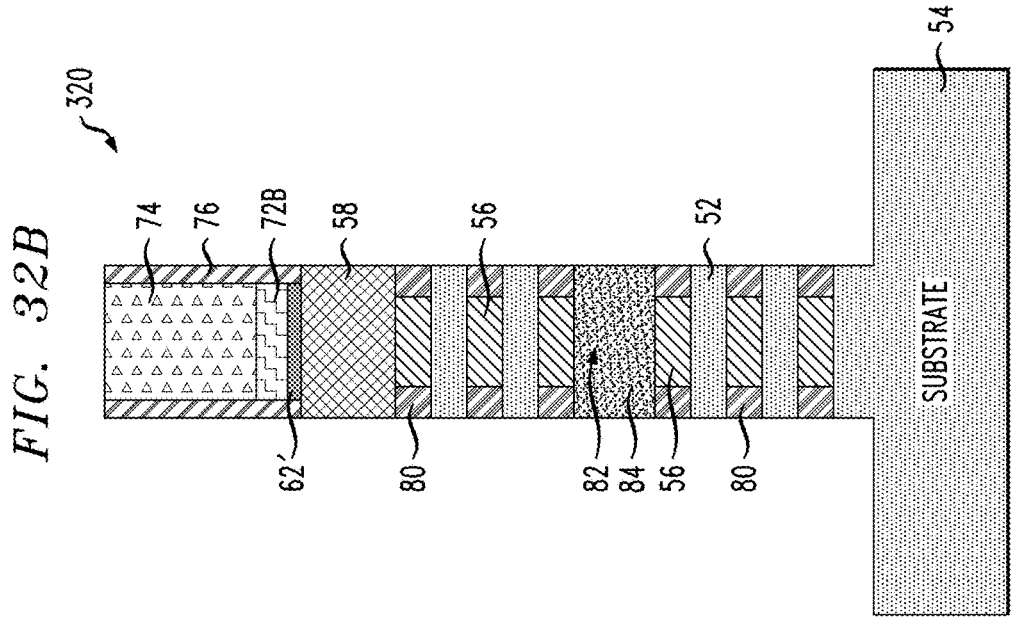
FIG. 32B is a schematic, cross-sectional view of the structure shown in FIG. 32A, taken along the y cross section.
Figure 32A:
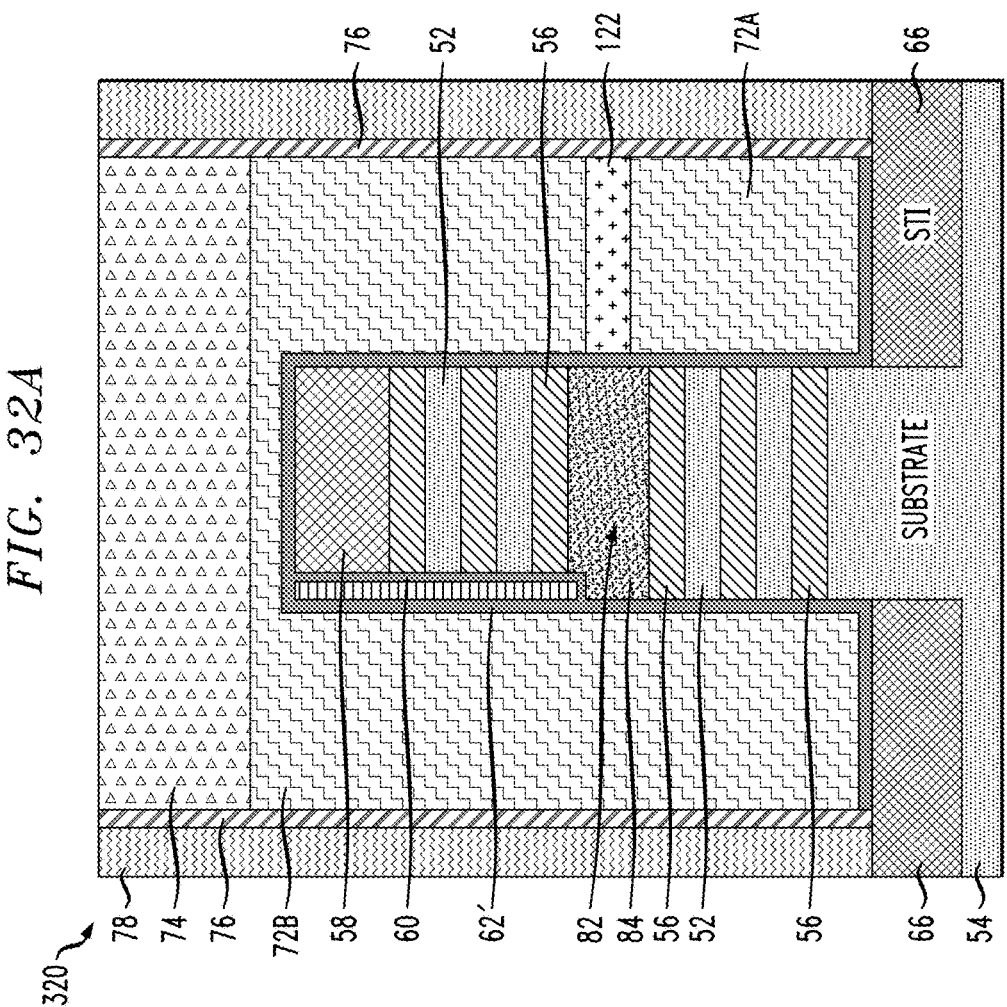
FIG. 32A is a schematic, cross-sectional view of the structure shown in FIG. 31A following replacement of the sacrificial layer within the nanosheet stack with an electrically isolating layer.

A dielectric fill layer 84 is deposited on the structure 310. A silicon nitride or silicon oxide liner may optionally be deposited prior to deposition of the dielectric fill layer. The dielectric fill layer 84 adjoins the top dielectric sidewall spacer 60 and fills the space 82 previously containing the relatively thick silicon layer 52'. The resulting structure is subjected to a reactive ion etch to remove the portions of the dielectric fill layer 84 outside the space 82 between sets of semiconductor nanosheet layers. As shown in FIG. 32A and FIG. 32B, the remaining portion of the dielectric fill layer 84 forms a dielectric spacer between the sets of semiconductor nanosheet channel layers. The resulting structure 320 accordingly includes a semiconductor nanosheet stack including a top portion that is electrically isolated from the bottom portion of the stack.

Figure 33:
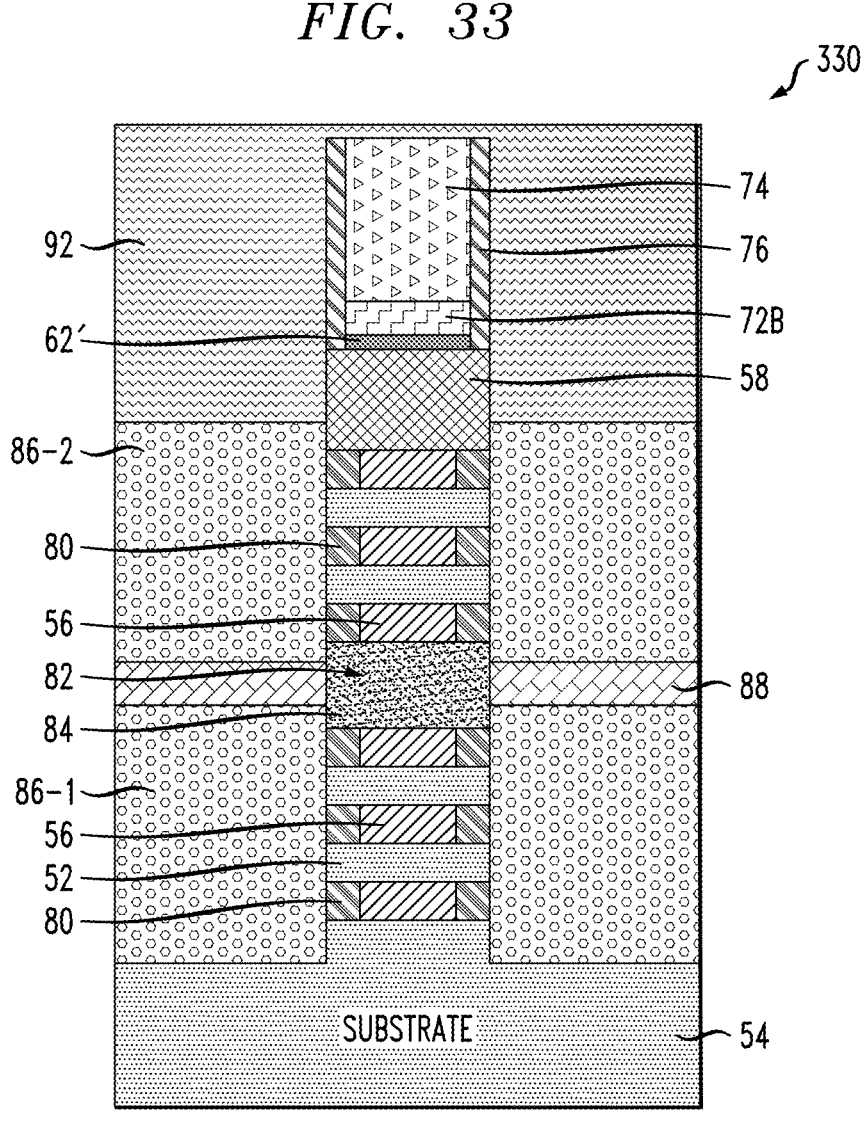
FIG. 33 is a schematic, cross-sectional view of the structure shown in FIG. 32B following deposition of various layers adjoining the nanosheet stack.

Source/drain regions 86-1, 86-2 are epitaxially grown on the exposed edges of the silicon channel layers 52. After growth of the bottom source/drain region 86-1 on the silicon channel layers 52 within the bottom portion of the semiconductor nanosheet stack, a dielectric layer 88 is deposited on the top surface thereof and recessed down to a level beneath the top surface of the adjoining dielectric fill layer 84 within the space 82. The bottom surface of the dielectric layer 88 is above the bottom surface of the dielectric fill (spacer) layer 84. The top source/drain region 86-2 is then grown on the end portions of the silicon channel layers 52 within the top portion of the semiconductor nanosheet stack. In one or more embodiments, the conductivity type of the top source/drain region 86-2 is opposite from the conductivity type of the bottom source/drain region 86.1. A dielectric top layer 92, for example a low-k interlayer dielectric, is deposited over the source/drain regions and planarized to obtain a structure 330 as schematically illustrated in the y cross-sectional direction in FIG. 33.

Figure 34B:
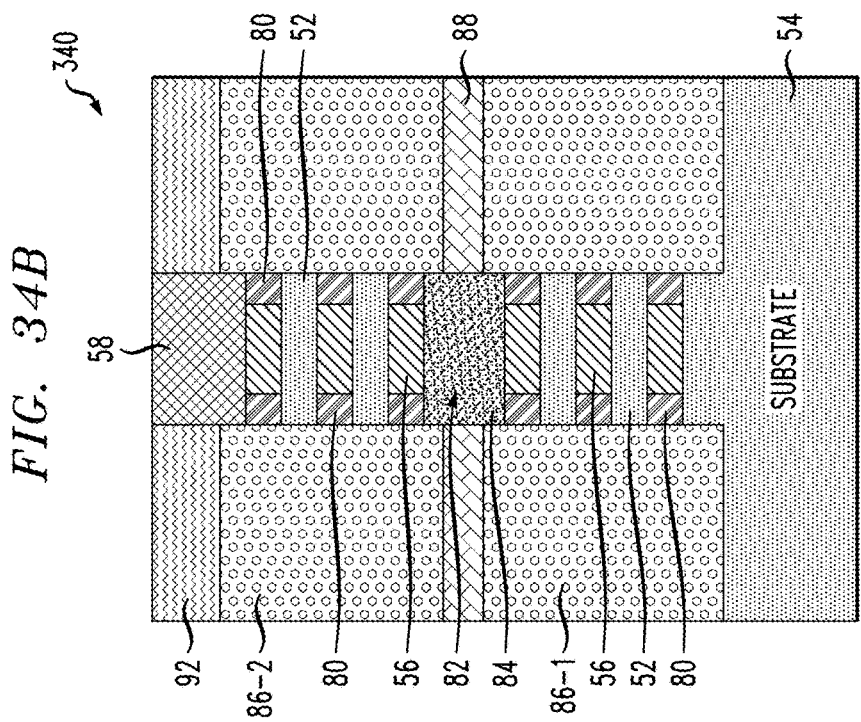
FIG. 34B is a schematic, cross-sectional view of the structure shown in FIG. 34A, taken along the y cross section.
Figure 34A:
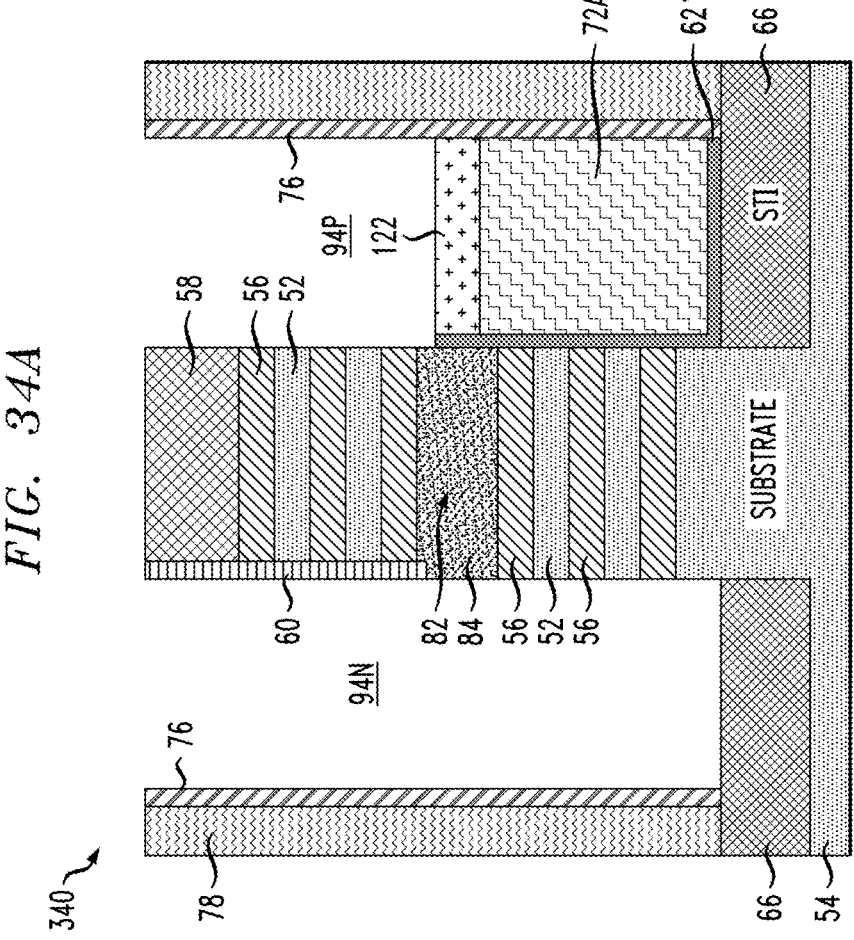
FIG. 34A is a schematic, cross-sectional view of the structure shown in FIG. 33, taken along the x cross section, following the formation of open pockets adjoining the nanosheet stack.

The second sacrificial gate 72B is exposed by selectively removing the hard mask 74 and adjoining structures down to the dielectric cap 58. It is then selectively removed by any suitable etching process, such as a reactive ion etch, to obtain a structure 340 as schematically illustrated in FIG. 34A and FIG. 34B. The bottom sacrificial gate 72A, being protected by the gate separator 122, remains intact. The resulting structure includes two RMG pockets 94N, 94P, one adjoining the bottom stack of semiconductor nanosheet layers and isolated from the top stack of such layers by the sidewall spacer 60. The other RMG pocket 94P adjoins the top stack of semiconductor nanosheet layers and is separated from the bottom nanosheet stack by the bottom gate separator 122 and a remaining portion of the oxide layer 62'.

Figure 35:
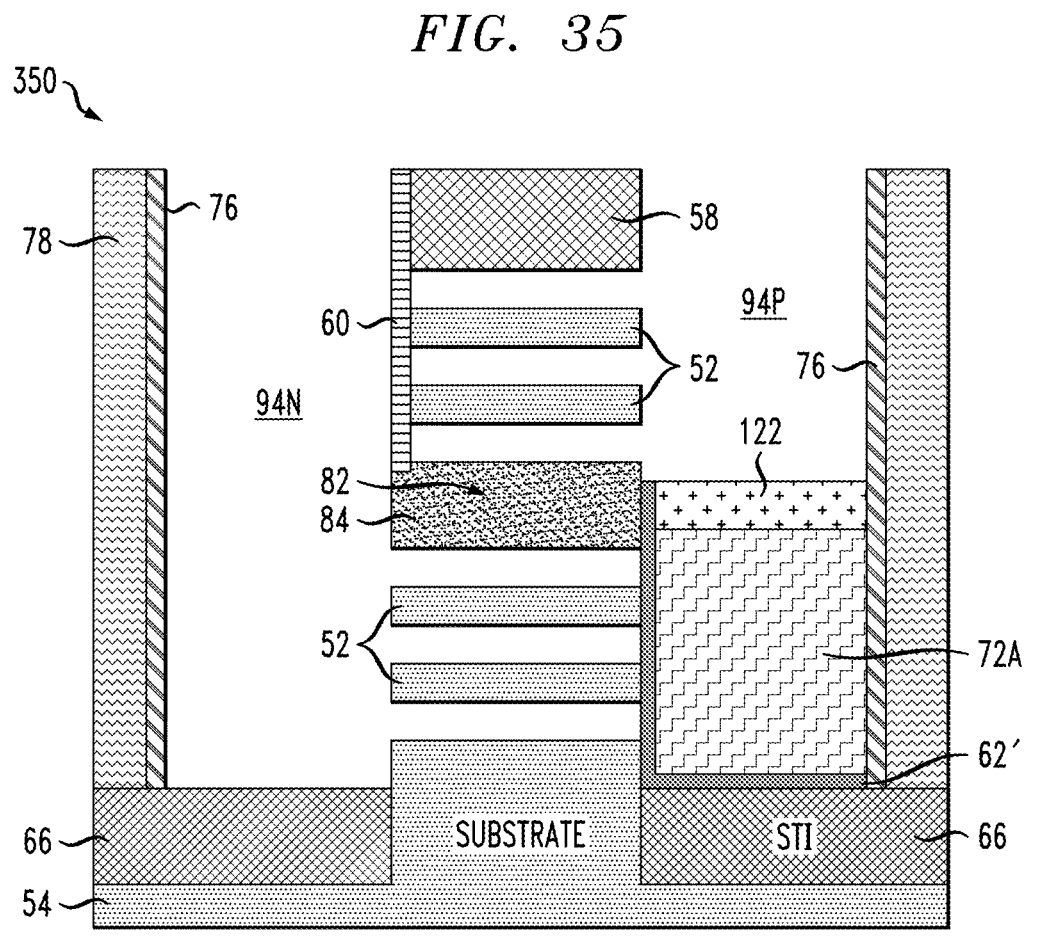

The silicon germanium layers 56 are selectively removed, leaving top and bottom stacks of silicon (channel) layers 52. As discussed above, hydrogen chloride gas is employed in some embodiments to selectively remove silicon germanium, leaving silicon nanosheets substantially intact. Alternatively, a wet etch process containing ammonia and hydroperoxide can be used to etch SiGe selective to other materials. As shown in FIG. 35, spaces are formed between the silicon (channel) nanosheet layers 52 of the resulting structure 180. The spaces within the bottom stack of nanosheet channel layers 52 are in communication with the first pocket 94N while the spaces within the top stack of nanosheet channel layers 52 are in communication only with the second pocket 94P. The second pocket 94P, having the gate separator as its lower boundary, has a lesser depth than the first pocket 94N. The vertical sidewall spacer 60 isolates the spaces between nanosheet channel layers above the dielectric fill layer 84 from the first pocket 94N. The horizontally extending gate separator 122 and top portion of the oxide layer 62' isolate the second pocket 94P from spaces below the dielectric fill layer 84.

The RMG process can be completed using techniques substantially as described above once a structure 350 as illustrated in FIG. 35 has been obtained. Gate stacks (shown with respect to the embodiment discussed above) are formed in adjoining relation to the nanosheet (channel) layers 52. A gate dielectric layer forms portions of the gate stacks that replace the sacrificial silicon germanium layers. The gate dielectric layer will adjoin the silicon nanosheet channel layers 52. In one exemplary embodiment, an n-type WFM layer having a thickness of three nanometers (3 nm) may be formed on the gate dielectric layer. The thickness of the WFM layer may, for example, be in the range of two to ten nanometers (2-10 nm), with thinner layers being used as device scaling decreases. The n-type WFM layer fills the spaces between silicon nanosheet channel layer 52 and forms a lining on both pockets 94N, 94P. the n-type WFM layer is removed from one pocket 94P and the spaces between channel layers above the dielectric fill layer 84 while the other pocket and spaces are protected by, for example, an organic planarization layer. Etch depth control is not required for removal of the n-type WFM layer as it is completely removed from the chosen pocket and spaces.

Following complete removal of the originally deposited n-type WFM layer from the pFET region, new gate metal deemed appropriate for pFET transistors is deposited. A p-type WFM layer is deposited in embodiments wherein the first-deposited metal is n-type. Exemplary WFM materials are described above. The p-type WFM layer fills the remaining open portion of the pocket 94N within the n-type WFM layer on one side of the structure. It further fills the pocket 94P on the opposite side of the structure and the spaces between the silicon nanosheet channel layers 52 above the dielectric fill layer 84. Stacked n-type and p-type nanosheet FETs are thereby formed. As discussed above, metal strapping electrically connecting the metal gates of the stacked nanosheet FETs can optionally be formed for designs that require such electrical connection.

The drawing figures as discussed above depict exemplary processing steps/stages in the fabrication of exemplary structures. Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling 1ˢᵗ Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having, for example, stacked nanosheet FET devices formed in accordance with one or more of the exemplary embodiments.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" and "vertical" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b). It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A monolithic semiconductor structure, comprising:
   a semiconductor substrate;
   a vertical stack extending from the semiconductor substrate, the vertical stack comprising a top set of nanosheet channel layers, a bottom set of nanosheet channel layers, and a dielectric spacer between the top set of nanosheet channel layers and the bottom set of nanosheet channel layers;
   a top dielectric sidewall spacer on a first side of the vertical stack and adjoining the top set of nanosheet channel layers and a first portion of the dielectric spacer;
   a bottom dielectric sidewall spacer on a second side of the vertical stack and adjoining the bottom set of nanosheet channel layers and a second portion of the dielectric spacer;
   a first pocket on the first side of the vertical stack;
   a second pocket on the second side of the vertical stack;
   a first gate stack comprising a gate dielectric layer and a first metal gate layer adjoining the gate dielectric layer, the first metal gate layer extending within the first pocket and between the nanosheet channel layers within the bottom set of the nanosheet channel layers, the top dielectric sidewall spacer being positioned between the top set of nanosheet channel layers and the first gate stack and isolating the first pocket from the second pocket and the top set of nanosheet channel layers;
   a second gate stack comprising the gate dielectric layer and a second metal gate layer adjoining the gate dielectric layer, the second metal gate layer extending within the second pocket and between the nanosheet channel layers within the top set of the nanosheet channel layers, the bottom dielectric sidewall spacer being positioned between the bottom set of nanosheet channel layers and the second gate stack and isolating the second pocket from the first pocket and the bottom set of nanosheet channel layers;
   first source/drain regions having a first conductivity type and adjoining the bottom nanosheet channel layers;

second source/drain regions having second conductivity type and adjoining the top nanosheet channel layers, the second conductivity type being opposite to the first conductivity type; and
   a metal strap electrically connecting the first metal gate layer and the second metal gate layer.

2. The monolithic semiconductor structure of claim 1, wherein the second metal gate layer extends within the first pocket and adjoins the first metal gate layer within the first pocket.

3. The monolithic semiconductor structure of claim 2, wherein the first metal gate layer comprises a first work function metal layer and the second metal gate layer comprises a second work function metal layer, one of the first work function metal layer and the second work function metal layer comprising an n-type work function metal, the other of the first work function metal layer and the second work function metal layer comprising a p-type work function metal.

4. The monolithic semiconductor structure of claim 3, wherein the vertical stack further includes a dielectric cap, the dielectric cap being positioned between the top set of nanosheet channel layers and the metal strap.

5. The monolithic semiconductor structure of claim 4, wherein the dielectric spacer within the vertical stack has a greater thickness than the thickness of each of the nanosheet channel layers.

6. The monolithic semiconductor structure of claim 5, wherein the width of the top set of nanosheet channel layers is greater than the width of the bottom set of nanosheet channel layers as measured in the direction between the first pocket and the second pocket.

7. The monolithic semiconductor structure of claim 1, wherein the width of the top set of nanosheet channel layers is greater than the width of the bottom set of nanosheet channel layers as measured in the direction between the first pocket and the second pocket.

8. The monolithic semiconductor structure of claim 1, further including a first dielectric sidewall gate spacer lining the first pocket and a second dielectric sidewall gate spacer lining the second pocket, the first dielectric sidewall gate spacer adjoining the first gate stack and the second dielectric sidewall gate spacer adjoining the second gate stack.

9. A monolithic semiconductor structure, comprising:
   a semiconductor substrate;
   a vertical stack extending from the semiconductor substrate, the vertical stack comprising a top set of nanosheet channel layers, a bottom set of nanosheet channel layers, and a dielectric spacer between the top set of nanosheet channel layers and the bottom set of nanosheet channel layers;
   a top dielectric sidewall spacer on a first side of the vertical stack and adjoining the top set of nanosheet channel layers and a first portion of the dielectric spacer;
   a horizontally extending separator layer on a second side of the vertical stack and horizontally aligned with the dielectric spacer within the vertical stack;
   a first pocket on the first side of the vertical stack;
   a second pocket on the second side of the vertical stack, the second pocket having the horizontally extending separator layer as its lower boundary;
   a first gate stack comprising a gate dielectric layer and a first metal gate layer adjoining the gate dielectric layer, the first metal gate layer extending within the first pocket and between the nanosheet channel layers within the bottom set of the nanosheet channel layers, the top dielectric sidewall spacer being positioned between the top set of nanosheet channel layers and the first gate stack;

a second gate stack comprising the gate dielectric layer a second metal gate layer adjoining the gate dielectric layer, the second metal gate layer extending within the second pocket and between the nanosheet channel layers within the top set of the nanosheet channel layers;

first source/drain regions having a first conductivity type and adjoining the bottom nanosheet channel layers; and second source/drain regions having a second conductivity type and adjoining the top nanosheet channel layers, the second conductivity type being opposite to the first conductivity type.

10. The monolithic semiconductor structure of claim 9, further including:

a metal strap electrically connecting the first metal gate layer and the second metal gate layer.

11. The monolithic semiconductor structure of claim 9, wherein the second metal gate layer extends within the first pocket and adjoins the first metal gate layer within the first pocket.

12. The monolithic semiconductor structure of claim 9, wherein the first metal gate layer comprises a first work function metal layer and the second metal gate layer comprises a second work function metal layer, one of the first work function metal layer and the second work function metal layer comprising an n-type work function metal, the other of the first work function metal layer and the second work function metal layer comprising a p-type work function metal.

13. The monolithic semiconductor structure of claim 12, wherein the vertical stack further includes a dielectric cap on the top set of nanosheet channel layers, the top dielectric sidewall spacer adjoining a side wall of the dielectric cap.

14. The monolithic semiconductor structure of claim 13, wherein the dielectric spacer within the vertical stack has a greater thickness than the thickness of each of the nanosheet channel layers.

15. The monolithic semiconductor structure of claim 13, wherein the width of the top set of nanosheet channel layers is greater than the width of the bottom set of nanosheet channel layers as measured in the direction between the first pocket and the second pocket.

16. The monolithic semiconductor structure of claim 13, further including a first dielectric sidewall gate spacer lining the first pocket and a second dielectric sidewall gate spacer lining the second pocket, the first dielectric sidewall gate spacer adjoining the first gate stack and the second dielectric sidewall gate spacer adjoining the second gate stack.

17. A method of fabricating a stacked nanosheet transistor architecture, comprising:

obtaining a monolithic structure including:

a semiconductor substrate;

a vertical stack extending from the semiconductor substrate, the vertical stack comprising bottom nanosheet channel layers, top nanosheet channel layers, a dielectric spacer between the bottom nanosheet channel layers and the top nanosheet channel layers, a dielectric cap above the top nanosheet channel layers, and sacrificial nanosheet semiconductor layers arranged in alternating sequence with the top nanosheet channel layers and with the bottom nanosheet channel layers;

a top source/drain region having a first conductivity type adjoining the top nanosheet channel layers;

a bottom source/drain region having a second conductivity type adjoining the bottom nanosheet channel layers, the second conductivity type being opposite from the first conductivity type;

a first pocket on a first side of the vertical stack;

a second pocket on a second side of the vertical stack;

a sacrificial gate layer within the first pocket and the second pocket;

a top dielectric sidewall spacer on a sidewall of a top portion of the vertical stack comprising the top nanosheet channel layers and the dielectric cap; and an isolation layer adjoining the sacrificial gate layer and positioned between the second pocket and the bottom nanosheet channel layers;

removing the sacrificial gate layer from the first pocket and from the second pocket;

removing the sacrificial nanosheet semiconductor layers, thereby forming spaces between each of the top nanosheet channel layers and each of the bottom nanosheet channel layers;

forming a gate dielectric layer on the top nanosheet channel layers and the bottom nanosheet channel layers;

depositing a first gate metal layer within the first pocket, the second pocket and between the top nanosheet channel layers and the bottom nanosheet channel layers;

removing the first gate metal layer from a gate region including:

one of the first pocket and the second pocket, and the spaces between one of the top nanosheet channel layers and the bottom nanosheet channel layers; and depositing a second gate metal layer in the gate region.

18. The method of claim 17, wherein the isolation layer comprises a bottom dielectric sidewall spacer on a sidewall of a bottom portion of the vertical stack comprising the bottom nanosheet channel layers, further including:

forming a metal strap extending above the dielectric cap and electrically connecting the first metal gate layer and the second metal gate layer.

19. The method of claim 17, wherein the isolation layer comprises a horizontally extending dielectric separator layer horizontally aligned with the dielectric spacer within the vertical stack.

20. The method of claim 17, further including depositing the second gate metal layer within the first pocket and the second pocket.

* * * * *